(12) United States Patent
Hadwen et al.

(10) Patent No.: US 10,661,245 B2
(45) Date of Patent: May 26, 2020

(54) METHOD OF DRIVING AN ELEMENT OF AN ACTIVE MATRIX EWOD DEVICE, A CIRCUIT, AND AN ACTIVE MATRIX EWOD DEVICE

(71) Applicant: Sharp Life Science (EU) Limited, Oxford (GB)

(72) Inventors: Benjamin James Hadwen, Oxford (GB); Christopher James Brown, Oxford (GB)

(73) Assignee: Sharp Life Science (EU) Limited, Oxford (GB)

( * ) Notice: Subject to any disclaimer, the term of this patent is extended or adjusted under 35 U.S.C. 154(b) by 363 days.

(21) Appl. No.: 15/527,836

(22) PCT Filed: Dec. 18, 2015

(86) PCT No.: PCT/JP2015/006320
§ 371 (c)(1),
(2) Date: May 18, 2017

(87) PCT Pub. No.: WO2016/110909
PCT Pub. Date: Jul. 14, 2016

(65) Prior Publication Data
US 2017/0326524 A1     Nov. 16, 2017

(30) Foreign Application Priority Data
Jan. 8, 2015 (GB) .................................. 1500261.1

(51) Int. Cl.
*B01J 19/00*     (2006.01)
*B01L 3/00*      (2006.01)
(Continued)

(52) U.S. Cl.
CPC ......... *B01J 19/004* (2013.01); *B01L 3/50273* (2013.01); *B01L 3/502792* (2013.01);
(Continued)

(58) Field of Classification Search
CPC ................ B01J 19/004; B01L 3/50273; B01L 3/502792; B01L 2300/161;
(Continued)

(56) References Cited

U.S. PATENT DOCUMENTS 8,173,000 B1 *  5/2012  Hadwen .............. B01L 3/50273
                                                    204/450
8,653,832 B2 *  2/2014  Hadwen ................... G09G 3/00
                                                    324/649
(Continued)

FOREIGN PATENT DOCUMENTS

EP     2404675     1/2012
EP     2476489     7/2012
(Continued)

OTHER PUBLICATIONS

International Search Report and Written Opinion for corresponding International application No. PCT/JP15/006320, dated Mar. 22, 2016.
(Continued)

*Primary Examiner* — Tom V Sheng
(74) *Attorney, Agent, or Firm* — Renner, Otto, Boisselle & Sklar, LLP

(57) ABSTRACT

A method of driving an element of an active matrix electrowetting on dielectric (AM-EWOD) device comprise applying a first alternating voltage to a reference electrode of the AM-EWOD device; and either (i) applying to the element electrode a second alternating voltage that has the same frequency as the first alternating voltage and that is out of phase with the first alternating voltage or (ii) holding the element electrode in a high impedance state. The effect of applying the second alternating voltage to the element electrode is to put the element in an actuated state in which the element is configured to actuate any liquid droplet present in the element, while the effect of holding the
(Continued)

element electrode in the high impedance state is to put the element in a non-actuated state.

13 Claims, 23 Drawing Sheets

(51) Int. Cl.
 *G09G 3/34* (2006.01)
 *F04B 19/00* (2006.01)
 *G01N 27/447* (2006.01)
 *H01L 21/67* (2006.01)
 *G02B 26/00* (2006.01)

(52) U.S. Cl.
 CPC ..... *F04B 19/006* (2013.01); *G01N 27/44769* (2013.01); *G09G 3/348* (2013.01); *H01L 21/67023* (2013.01); *H01L 21/67132* (2013.01); *B01L 2300/0816* (2013.01); *B01L 2400/0424* (2013.01); *B01L 2400/0427* (2013.01); *G02B 26/005* (2013.01); *G09G 2230/00* (2013.01); *G09G 2300/0842* (2013.01); *G09G 2300/0852* (2013.01); *G09G 2300/0857* (2013.01); *G09G 2310/0251* (2013.01)

(58) Field of Classification Search
 CPC ..... B01L 2300/0816; B01L 2400/0424; B01L 2400/0427; F04B 19/006; G01N 27/44769; G09G 3/348; G09G 2230/00; G09G 2300/0842; G09G 2300/0852; G09G 2300/0857; G09G 2310/0251; H01L 21/67023; H01L 21/67132; B02B 26/005
 See application file for complete search history.

(56) References Cited

U.S. PATENT DOCUMENTS

| | | | | |
|---|---|---|---|---|
| 10,330,920 | B2* | 6/2019 | Brown | G02B 26/005 |
| 10,369,570 | B2* | 8/2019 | Hadwen | B01L 3/502715 |
| 2007/0242111 | A1* | 10/2007 | Pamula | B41J 2/125 |
| | | | | 347/81 |
| 2011/0247934 | A1* | 10/2011 | Wang | B01L 3/502792 |
| | | | | 204/450 |
| 2012/0268804 | A1* | 10/2012 | Hadwen | B01L 3/502792 |
| | | | | 359/290 |
| 2013/0062205 | A1* | 3/2013 | Hadwen | B01L 3/502784 |
| | | | | 204/451 |
| 2013/0271153 | A1* | 10/2013 | Hadwen | B01L 3/502707 |
| | | | | 324/551 |
| 2014/0151232 | A1* | 6/2014 | Hadwen | B01L 3/502792 |
| | | | | 204/547 |
| 2014/0197028 | A1* | 7/2014 | Jacobs | B01L 3/502792 |
| | | | | 204/450 |
| 2014/0202863 | A1* | 7/2014 | Hadwen | B01L 3/502792 |
| | | | | 204/547 |
| 2017/0074814 | A1* | 3/2017 | Hadwen | G01N 27/028 |
| 2018/0078934 | A1* | 3/2018 | Hadwen | B01L 3/50273 |

FOREIGN PATENT DOCUMENTS

| | | |
|---|---|---|
| EP | 2570188 | 3/2013 |
| JP | 2012-176397 A | 9/2012 |
| JP | 2014-140841 A | 8/2014 |
| WO | WO 2009/019658 A2 | 2/2009 |

OTHER PUBLICATIONS

Extended European Search Report of EP 15876789 dated Nov. 23, 2017.

* cited by examiner

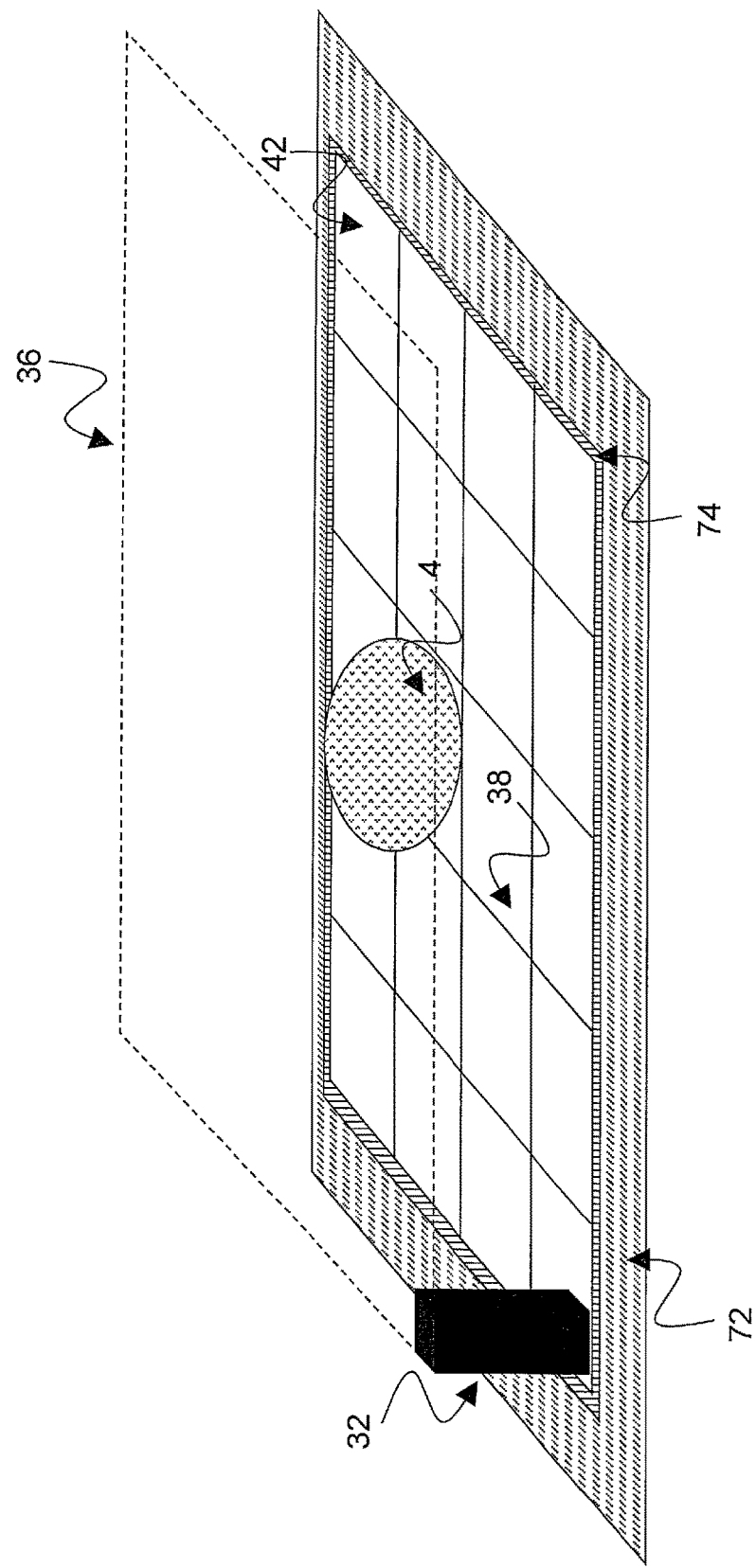
*Figure 2: First embodiment*

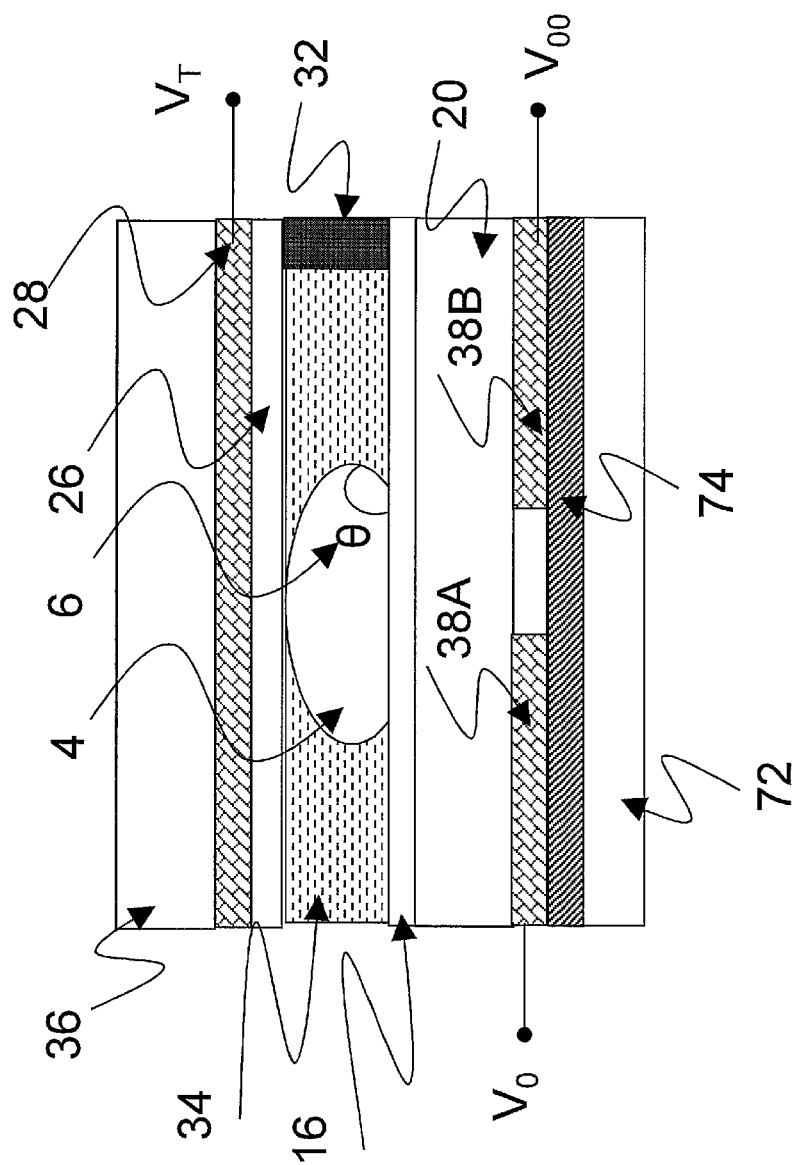
*Figure 3: First embodiment*

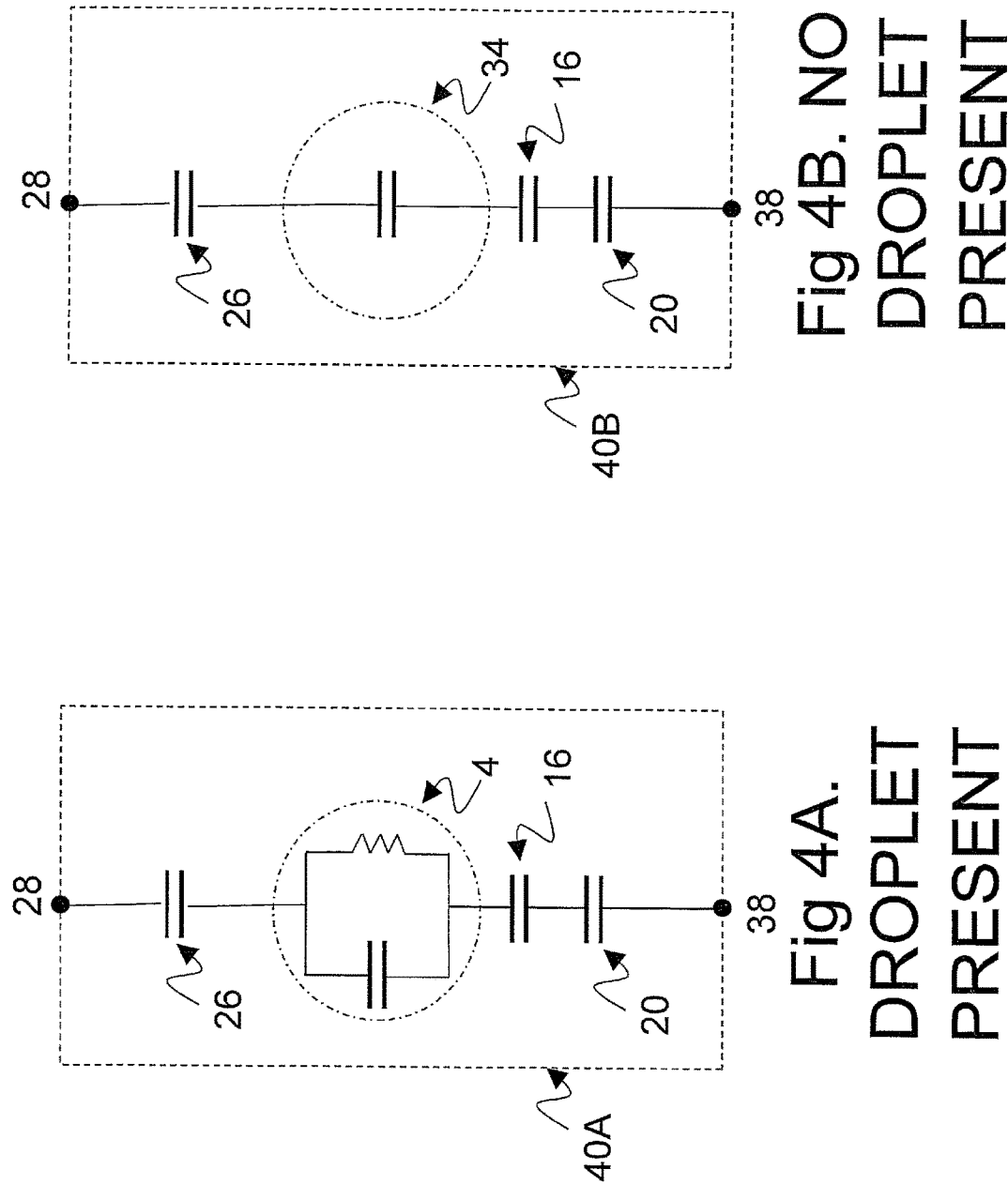
Figure 4: First embodiment

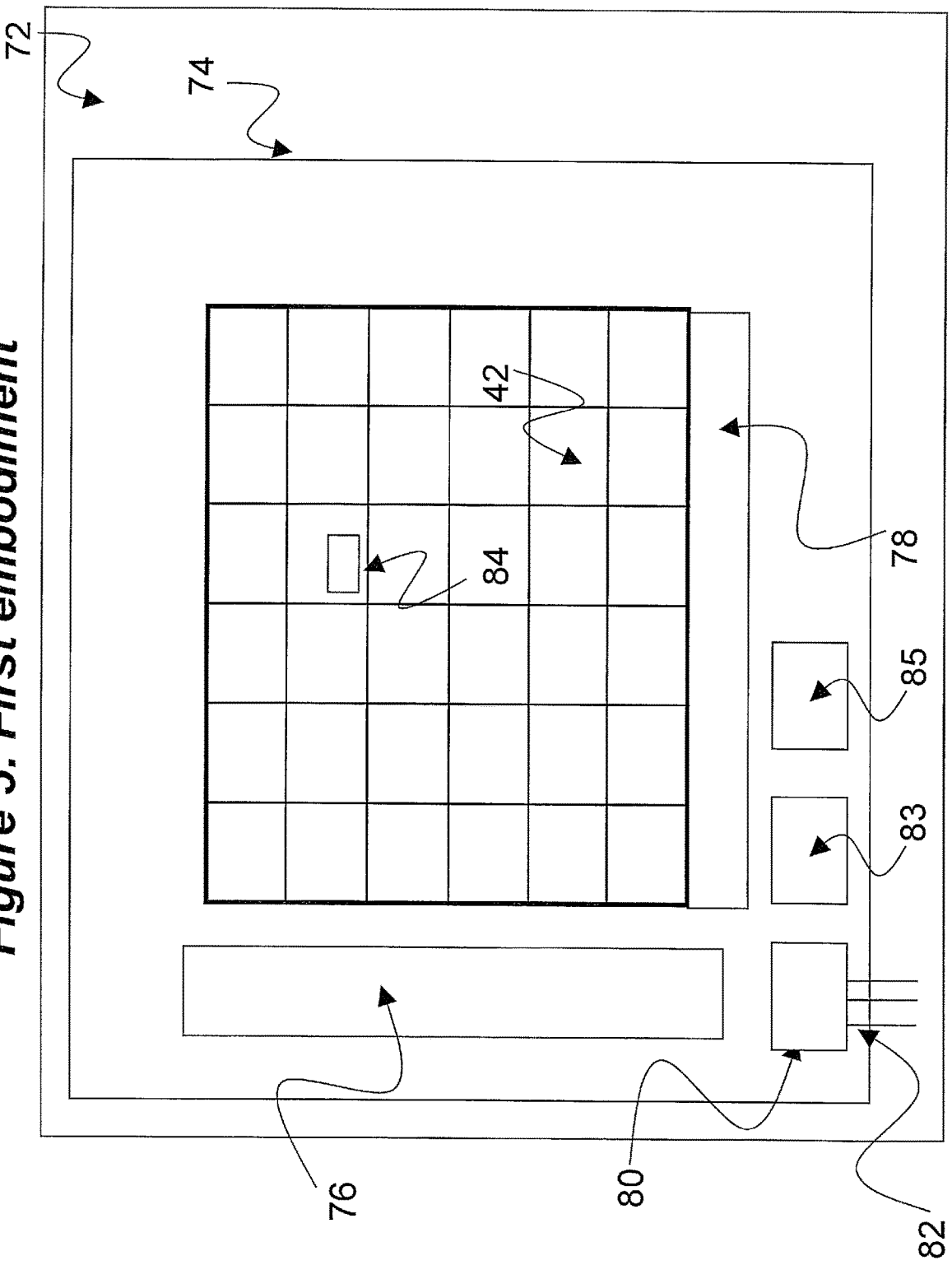
Figure 5: First embodiment

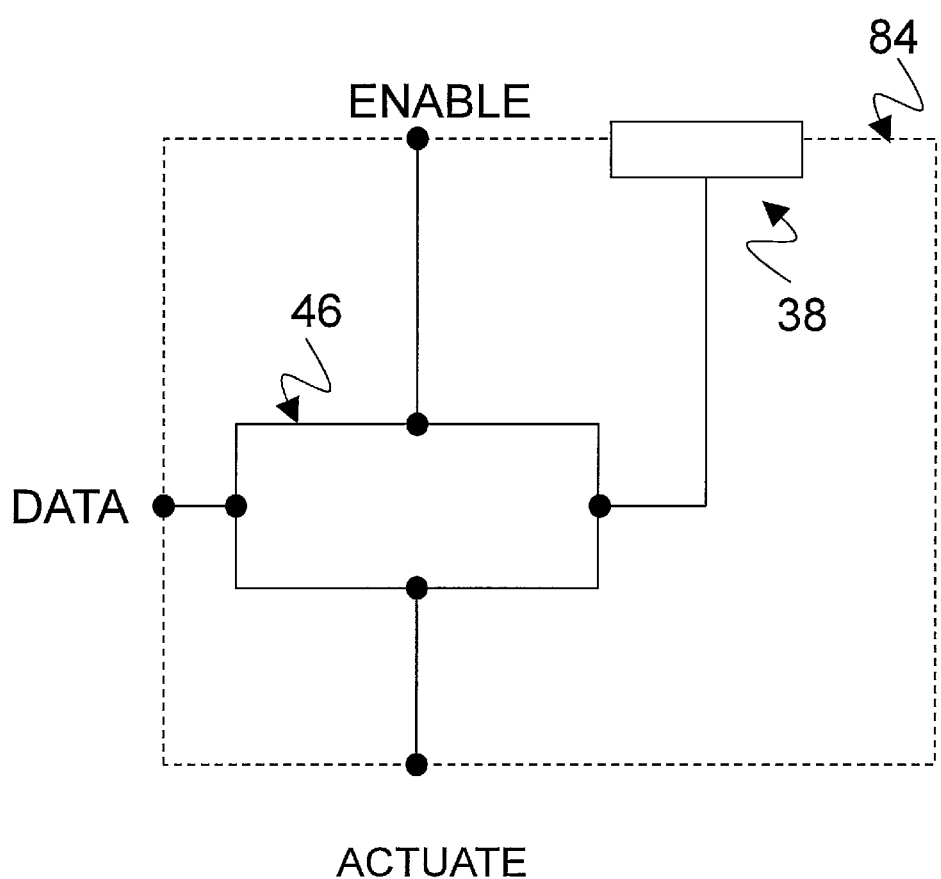
*Figure 6: First embodiment*

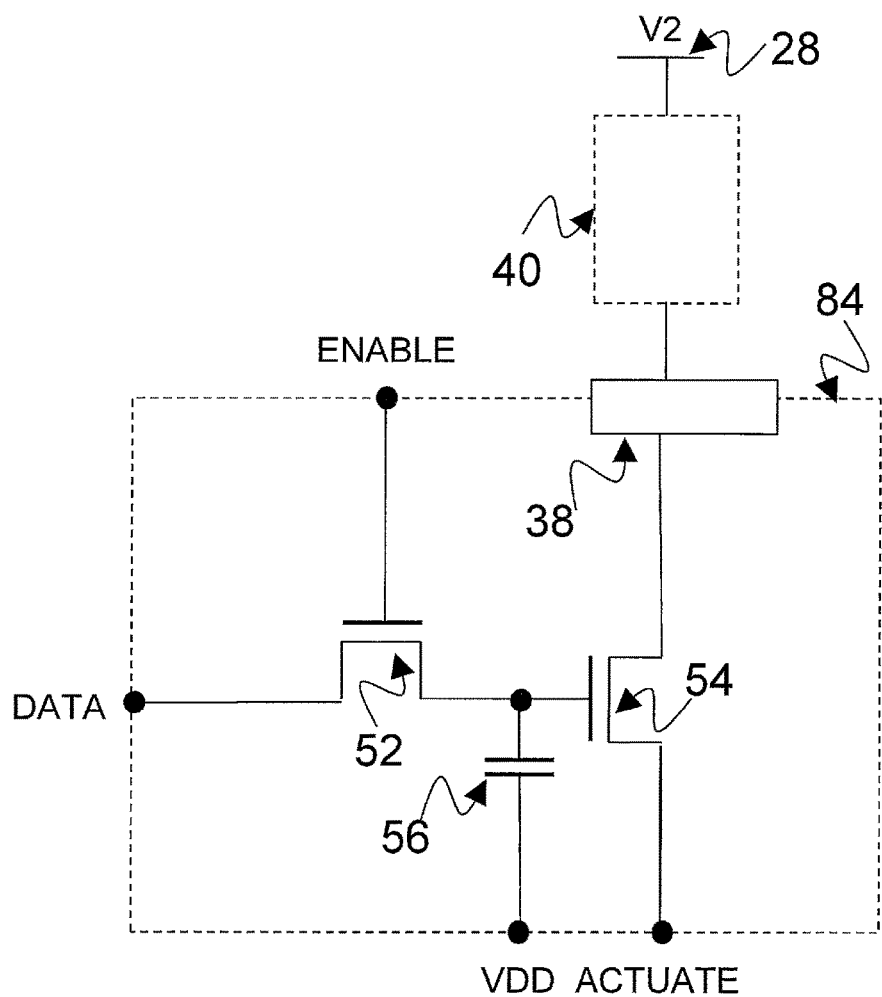
Figure 7: 1st embodiment

Figure 8: 1st embodiment
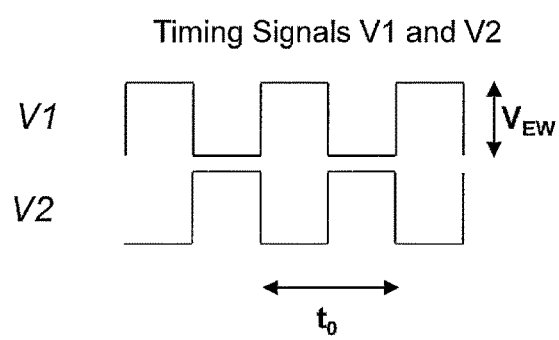

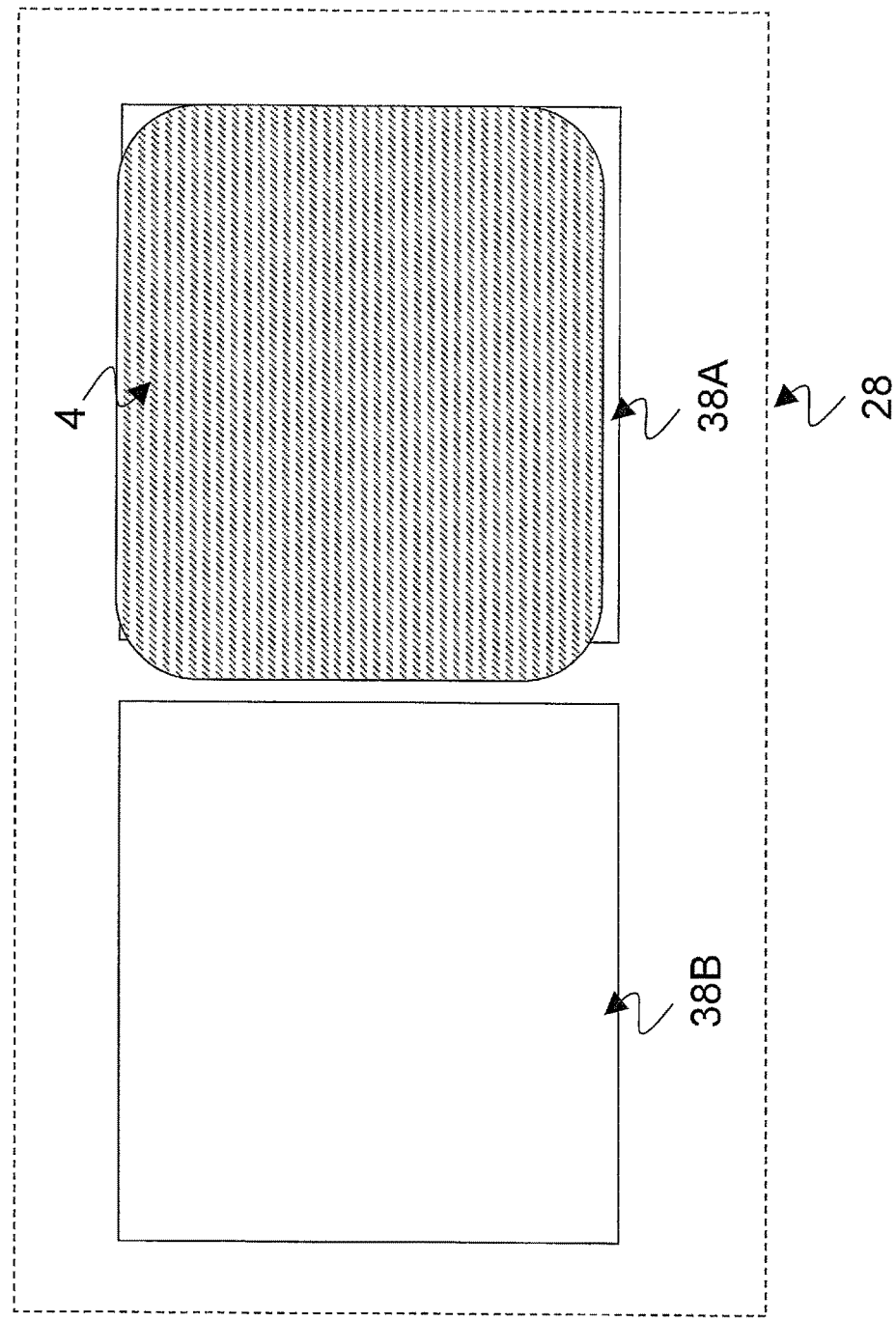
Figure 9: 1st embodiment

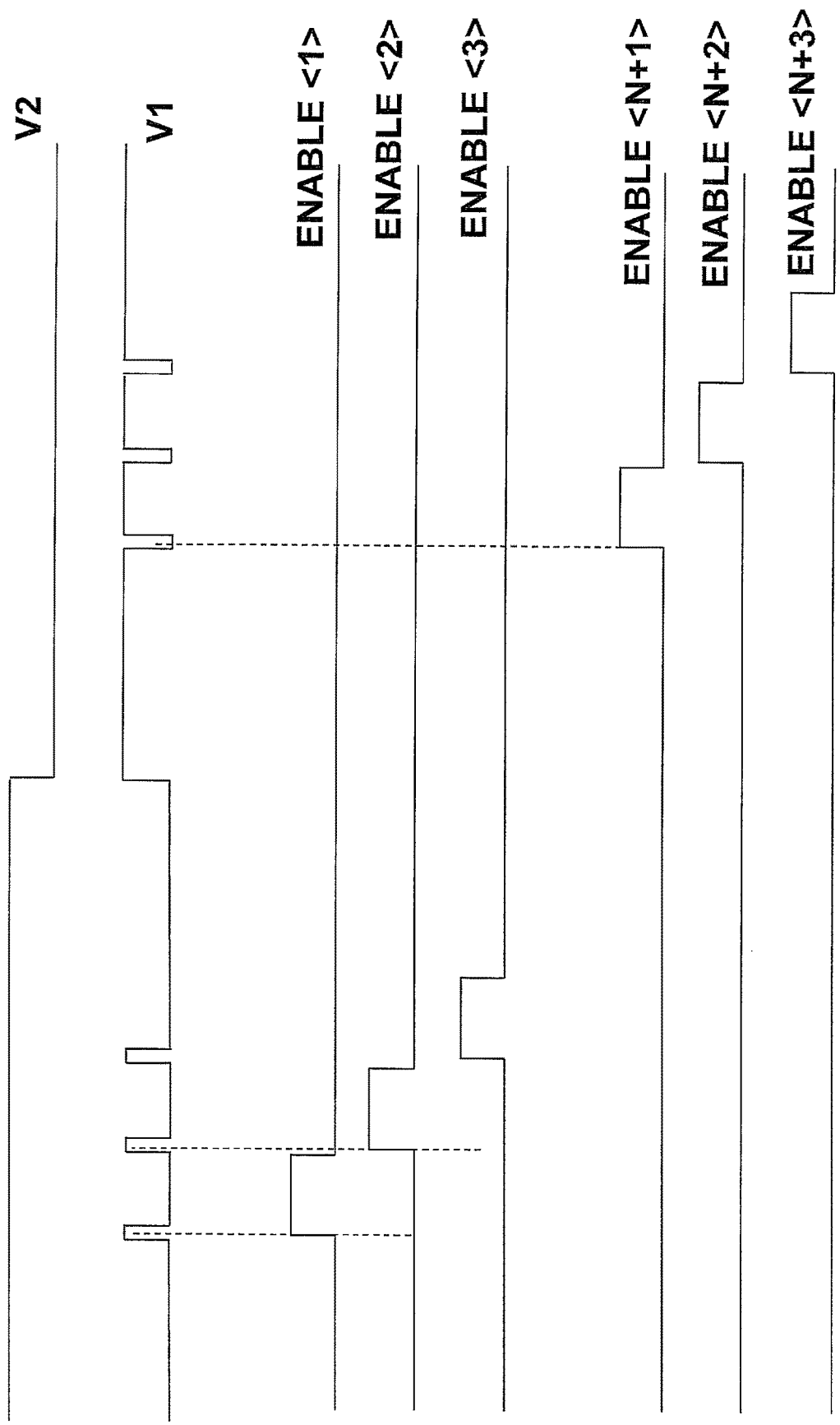
Figure 10: First embodiment

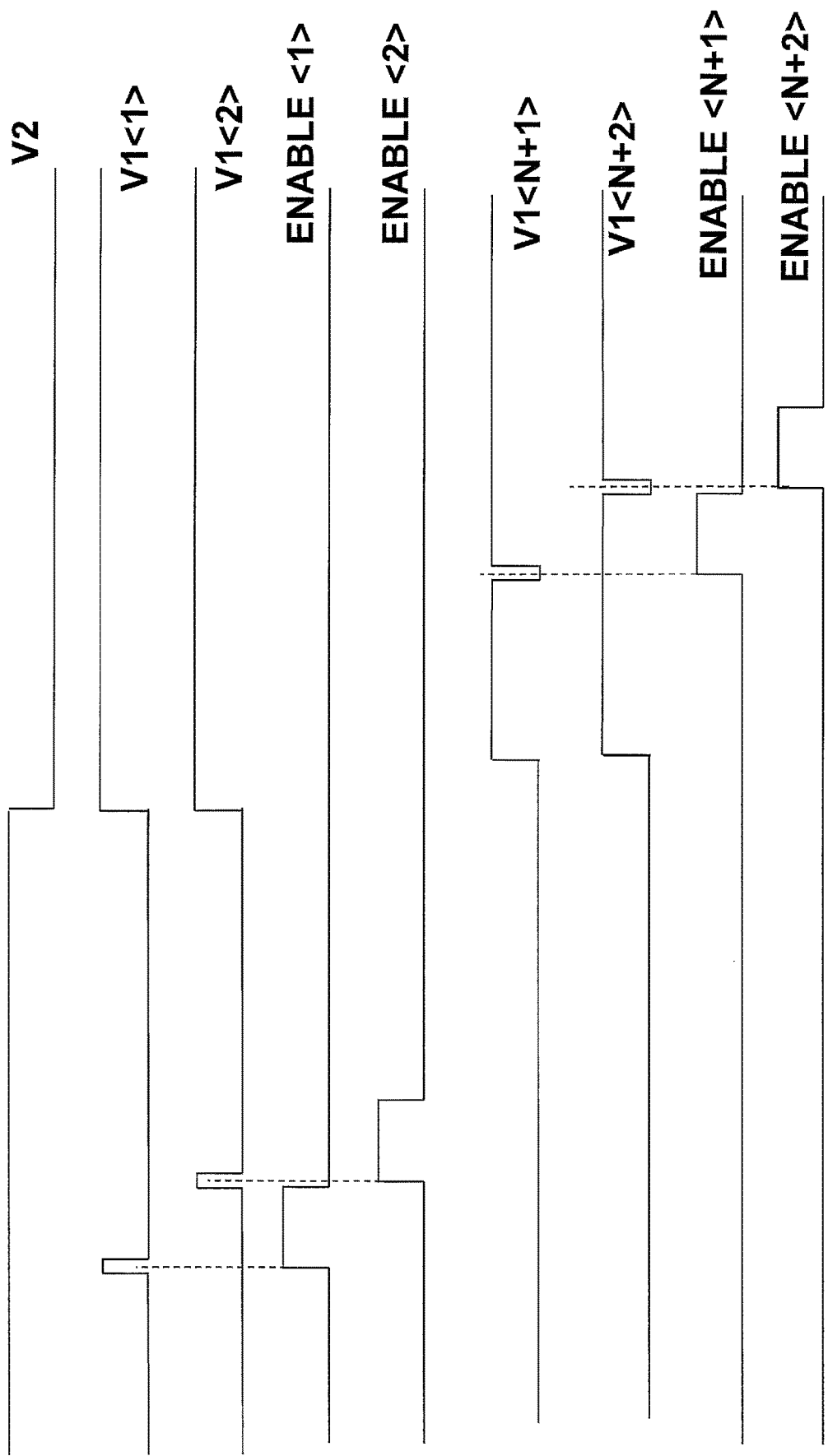
Figure 11: Second embodiment

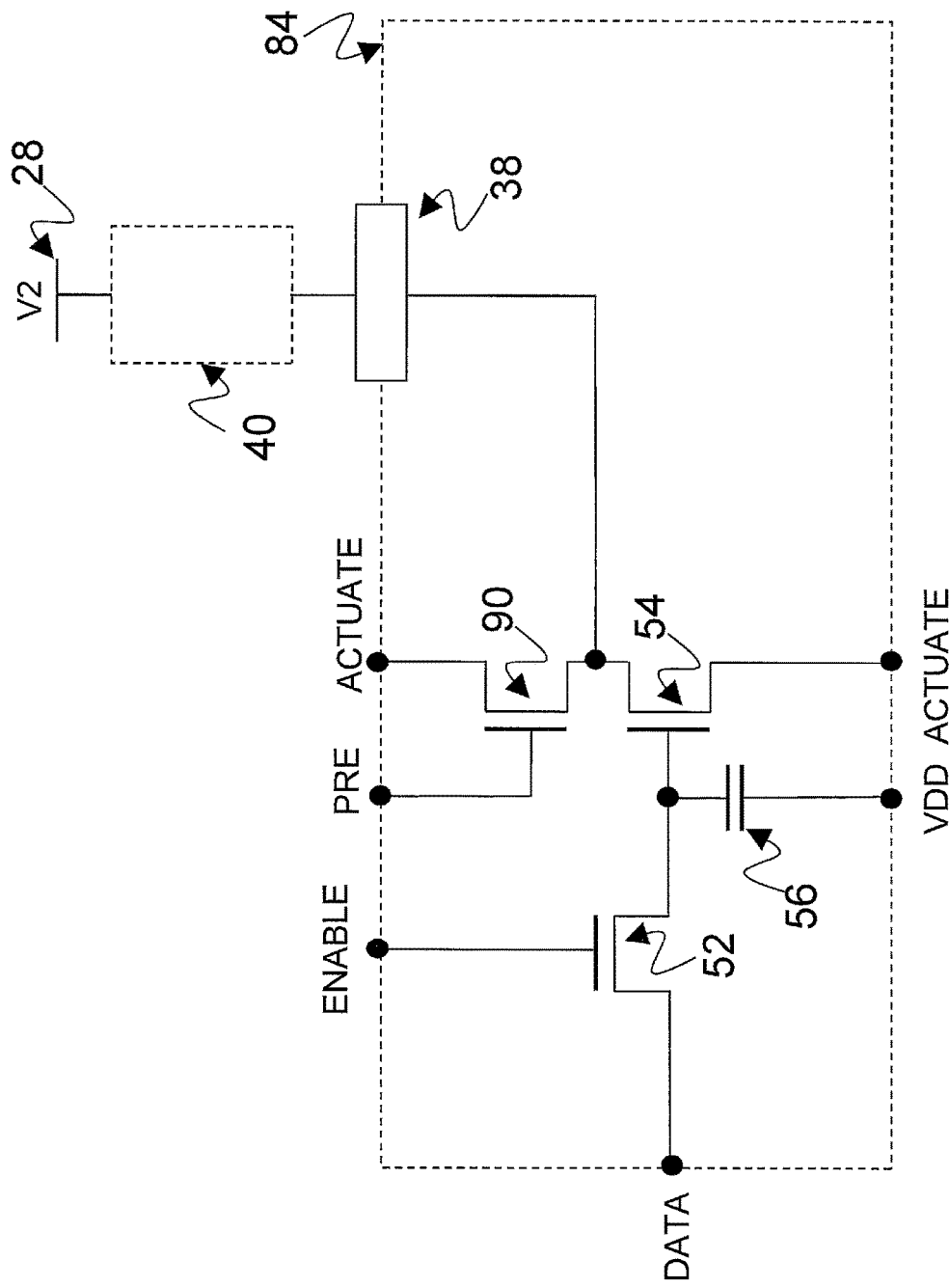
Figure 12: 3rd embodiment

Figure 13: 4th embodiment
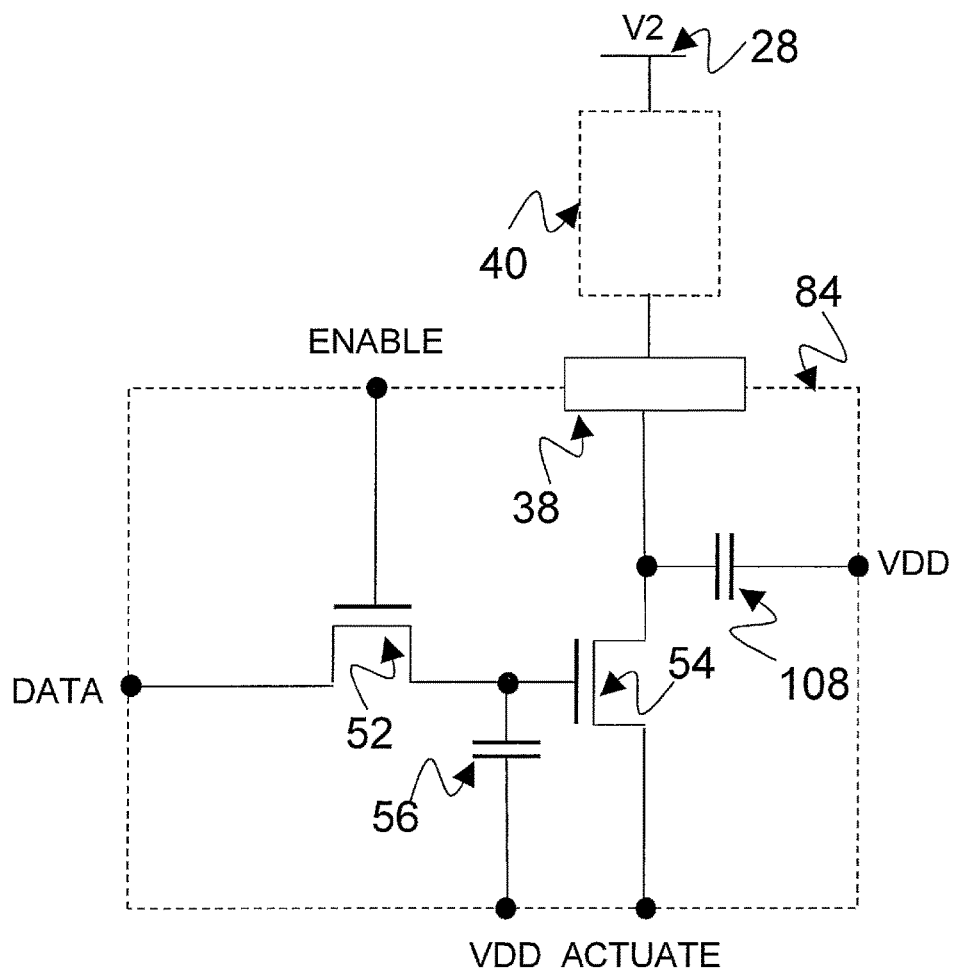

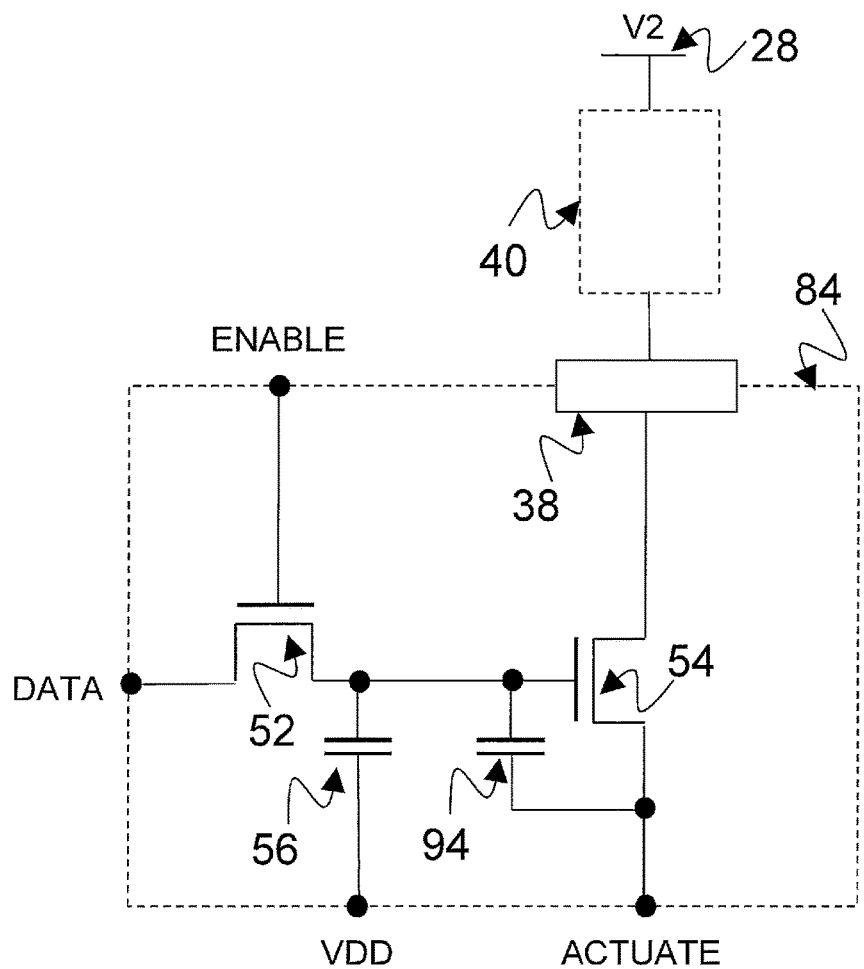
*Figure 14: 5th embodiment*

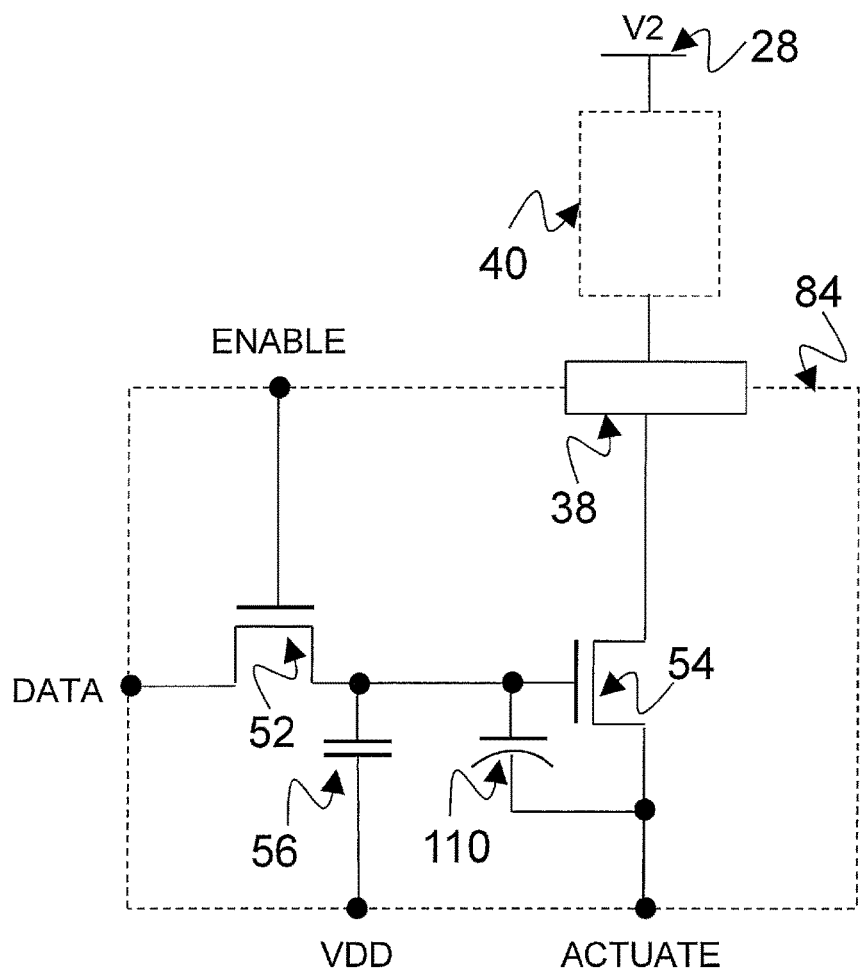
*Figure 15: 6th embodiment*

Figure 16: 6th embodiment
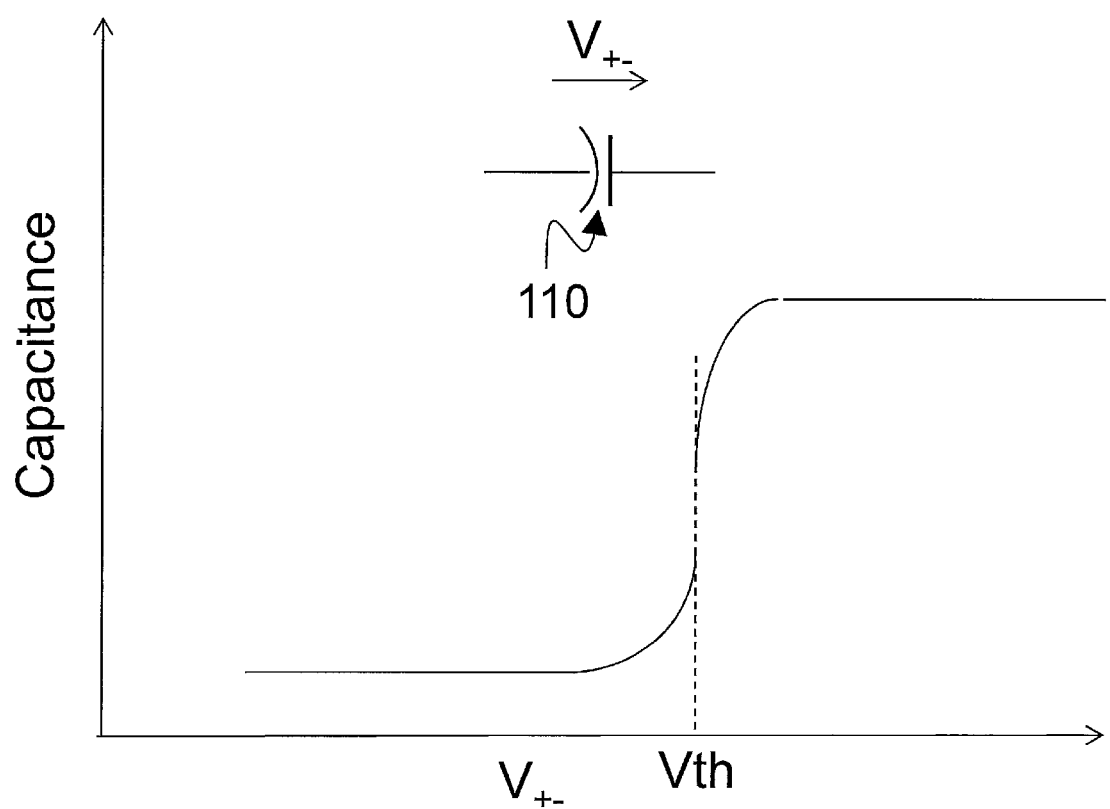

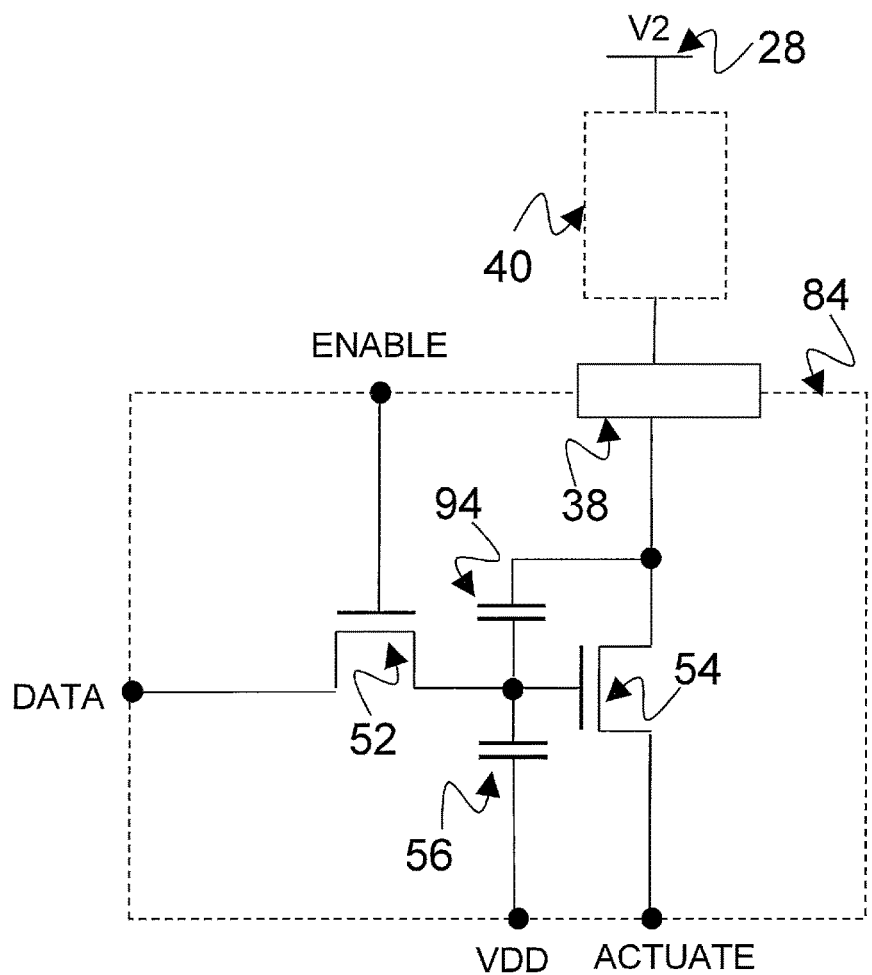
*Figure 17: 7th embodiment*

Figure 18: 8th embodiment
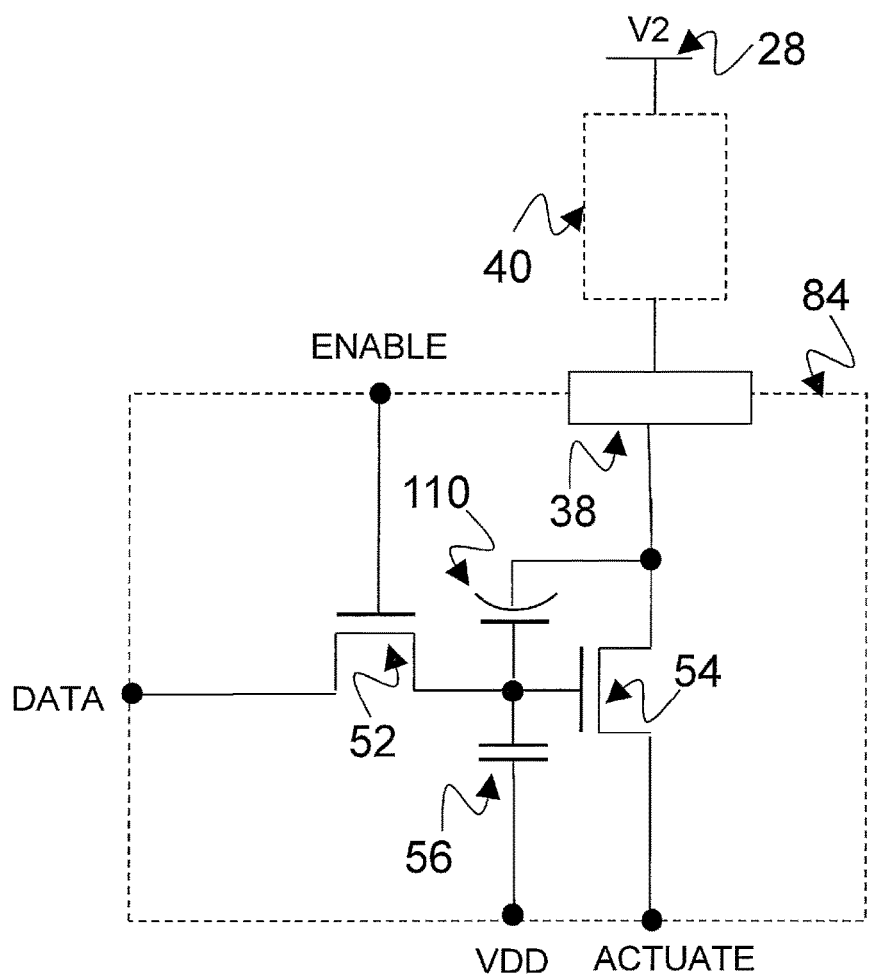

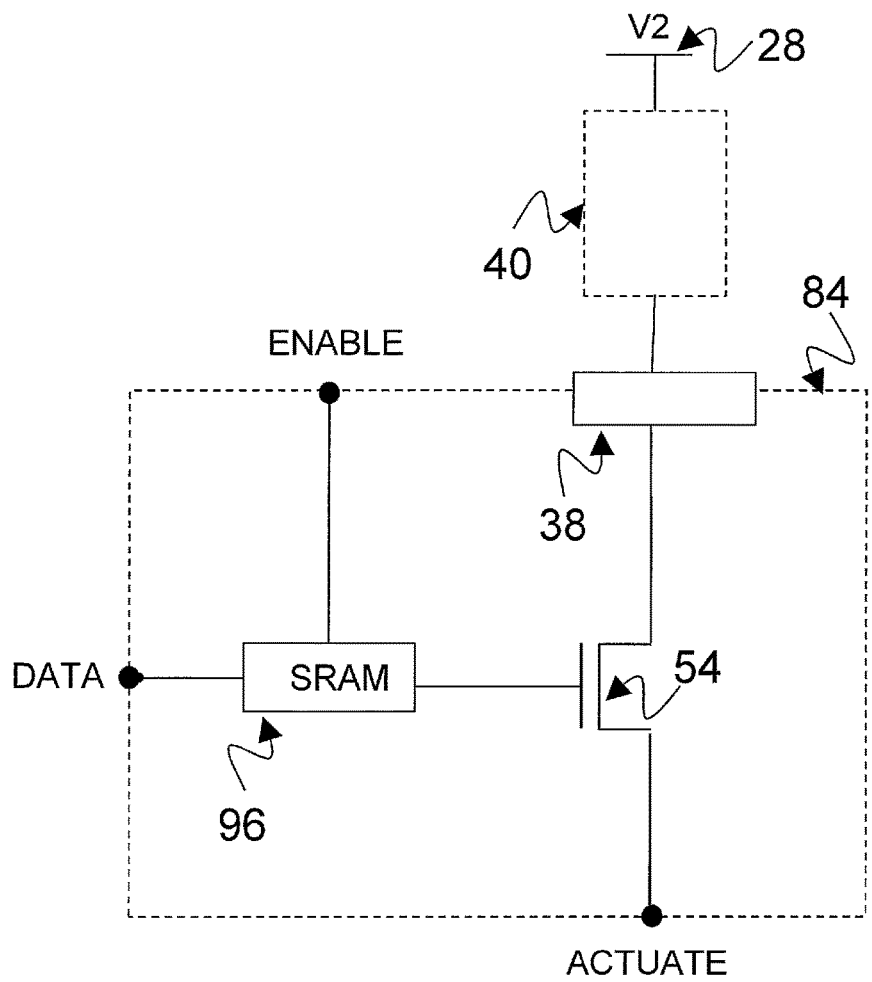
*Figure 19: 9th embodiment*

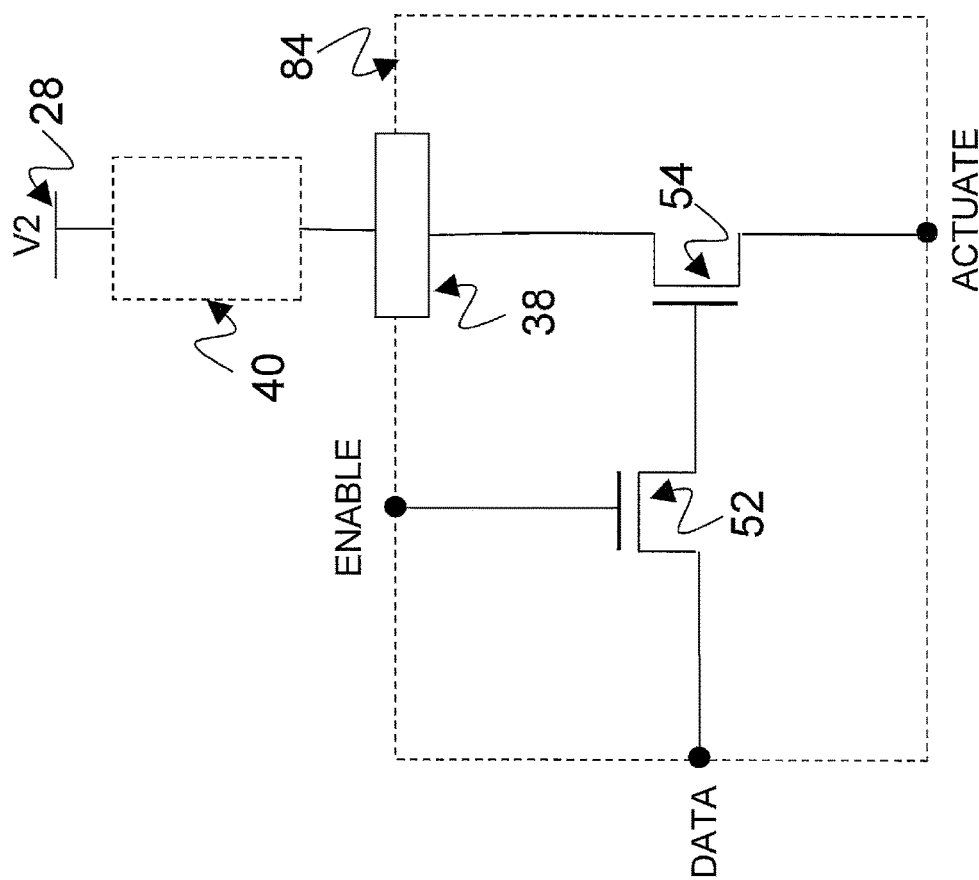
Figure 20: 10th embodiment

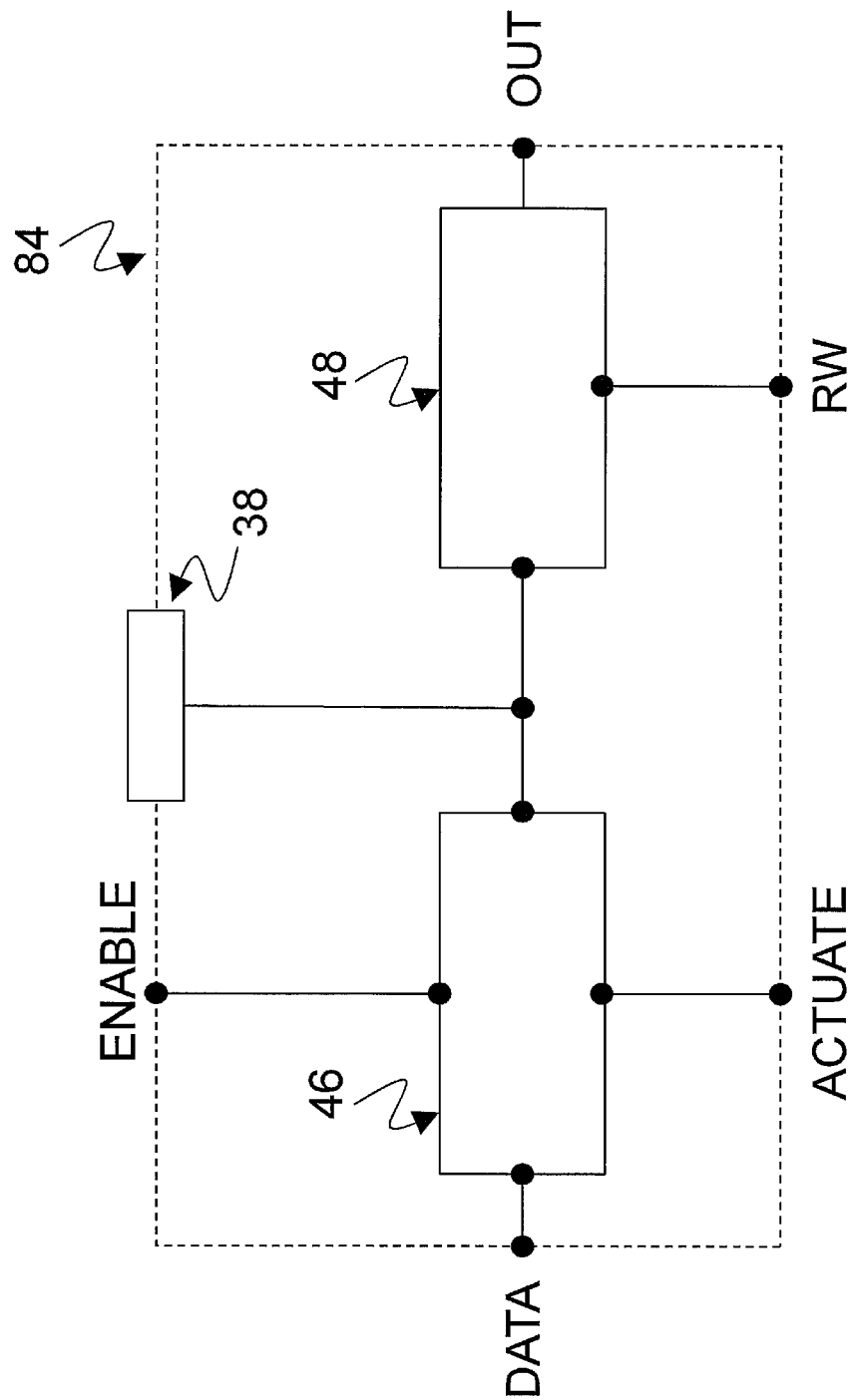

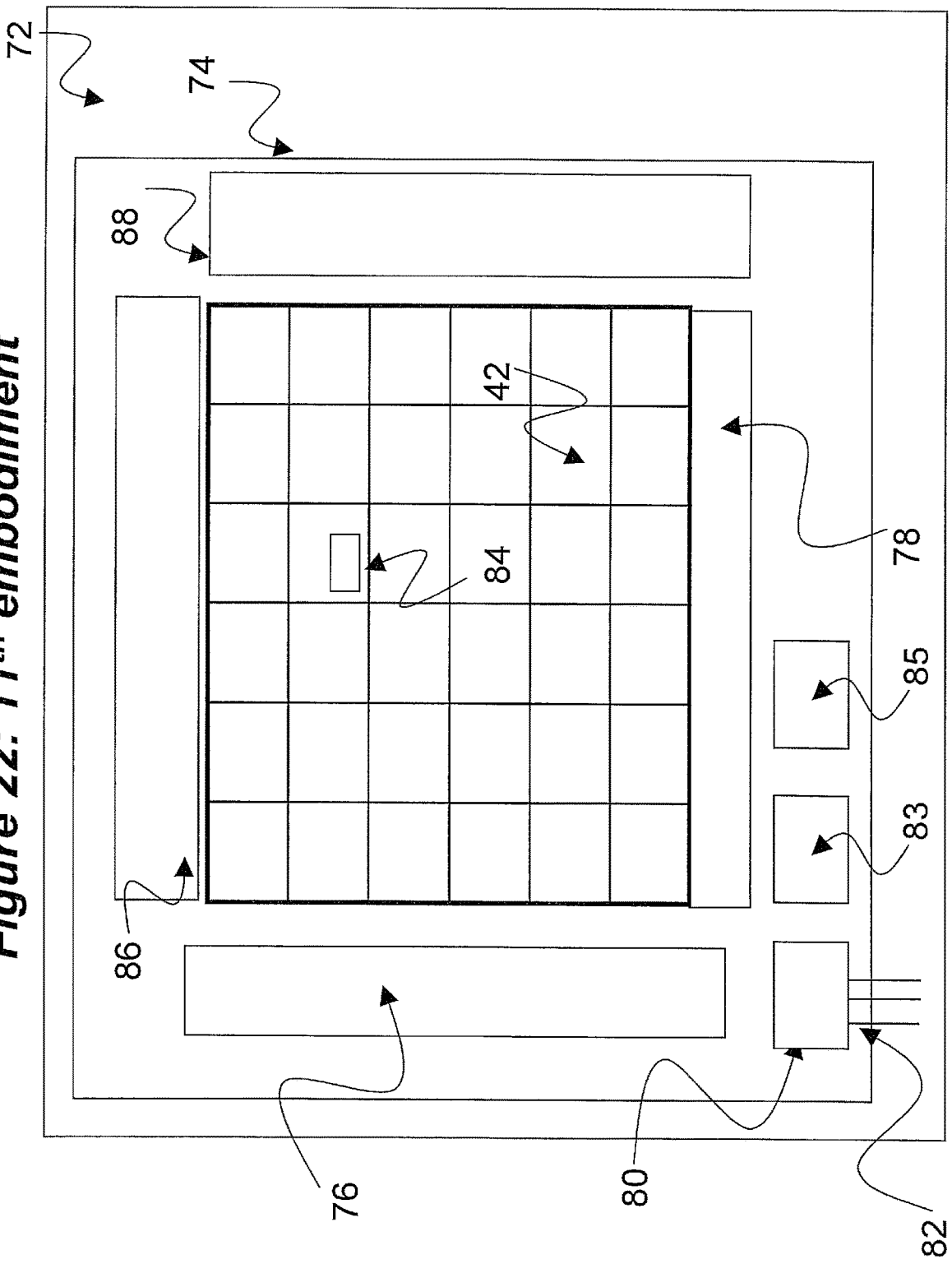
Figure 22: 11th embodiment

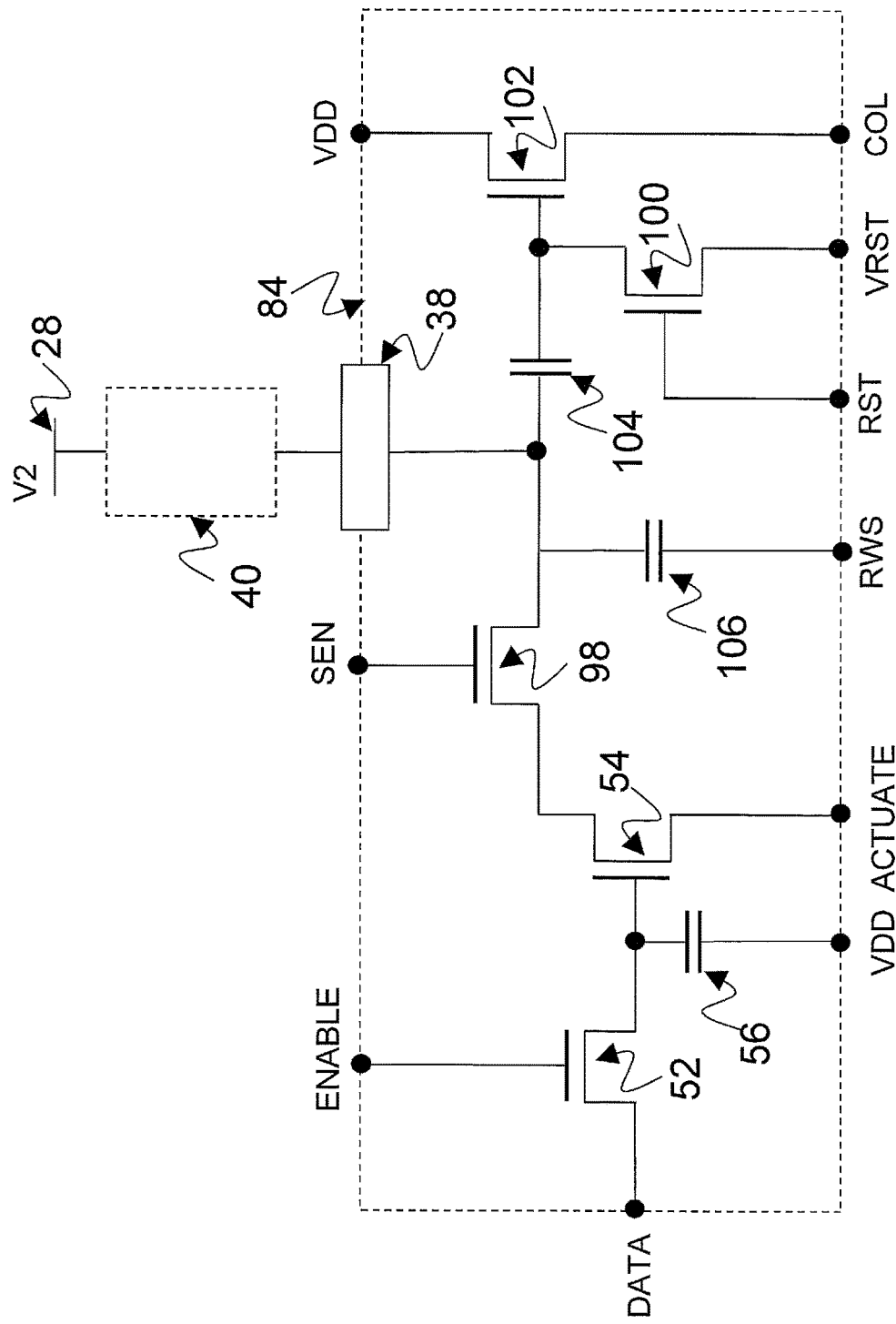
Figure 23: 11th embodiment

METHOD OF DRIVING AN ELEMENT OF AN ACTIVE MATRIX EWOD DEVICE, A CIRCUIT, AND AN ACTIVE MATRIX EWOD DEVICE

RELATED APPLICATIONS

This application is a national phase of International Patent Application Serial No. PCT/JP2015/006320, filed on Dec. 18, 2015 which claims priority to GB Application No. 1500261.1 filed on Jan. 8, 2015, the entire disclosures of which are hereby incorporated by reference.

TECHNICAL FIELD

The present invention relates to active matrix arrays and elements thereof. In a particular aspect, the present invention relates to digital microfluidics, and more specifically to Active Matrix Electro-wetting-On-Dielectric (AM-EWOD). Electro-wetting-On-Dielectric (EWOD) is a known technique for manipulating droplets of fluid on an array. Active Matrix EWOD (AM-EWOD) refers to implementation of EWOD in an active matrix array incorporating transistors, for example by using thin film transistors (TFTs). The invention further relates to methods of driving such a device.

BACKGROUND ART

Electro-wetting on dielectric (EWOD) is a well known technique for manipulating droplets of fluid by application of an electric field. It is thus a candidate technology for digital microfluidics for lab-on-a-chip technology. An introduction to the basic principles of the technology can be found in "Digital microfluidics: is a true lab-on-a-chip possible?", R. B. Fair, Microfluid Nanofluid (2007) 3:245-281.

FIG. 1 shows a part of a conventional EWOD device in cross section. The device includes a lower substrate 72, the uppermost layer of which is formed from a conductive material which is patterned so that a plurality of electrodes 38 (e.g., 38A and 38B in FIG. 1) are realized. The electrode of a given array element may be termed the element electrode 38. The liquid droplet 4, consisting of a polar material (which is commonly also aqueous and/or ionic), and is constrained in a plane between the lower substrate 72 and a top substrate 36. A suitable gap between the two substrates may be realized by means of a spacer 32, and a non-polar fluid 34 (e.g. oil) may be used to occupy the volume not occupied by the liquid droplet 4. An insulator layer 20 disposed upon the lower substrate 72 separates the conductive element electrodes 38A, 38B from a first hydrophobic coating 16 upon which the liquid droplet 4 sits with a contact angle 6 represented by θ. The hydrophobic coating is formed from a hydrophobic material (commonly, but not necessarily, a fluoropolymer).

On the top substrate 36 is a second hydrophobic coating 26 with which the liquid droplet 4 may come into contact. Interposed between the top substrate 36 and the second hydrophobic coating 26 is a reference electrode 28.

The contact angle θ 6 is defined as shown in FIG. 1, and is determined by the balancing of the surface tension components between the solid-liquid ($\gamma_{SL}$), liquid-gas ($\gamma_{LG}$) and non-polar fluid ($\gamma_{SG}$) interfaces, and in the case where no voltages are applied satisfies Young's law, the equation being given by:

$$\cos\theta = \frac{\gamma_{SG} - \gamma_{SL}}{\gamma_{LG}} \qquad \text{(equation 1)}$$

In certain cases, the relative surface tensions of the materials involved (i.e the values of $\gamma_{SL}$, $\gamma_{LG}$ and $\gamma_{SG}$) may be such that the right hand side of equation (1) is less than −1. This may commonly occur in the case in which the non-polar fluid 34 is oil. Under these conditions, the liquid droplet 4 may lose contact with the hydrophobic coatings 16 and 26, and a thin layer of the non-polar fluid 34 (oil) may be formed between the liquid droplet 4 and the hydrophobic coatings 16 and 26.

In operation, voltages termed the EW drive voltages, (e.g. $V_T$, $V_0$ and $V_{00}$ in FIG. 1) may be externally applied to different electrodes (e.g. element electrodes 38, 38A and 38B, respectively). The resulting electrical forces that are set up effectively control the hydrophobicity of the hydrophobic coating 16. By arranging for different EW drive voltages (e.g. $V_0$ and $V_{00}$) to be applied to different element electrodes (e.g. 38A and 38B), the liquid droplet 4 may be moved in the lateral plane between the two substrates 72 and 36.

In the following description, it will be assumed that an element of an EWOD device, such as the device of FIG. 1, may receive "digital" data so that the element is required to be put in either an "actuated" state (in which the voltage applied across the element is sufficient for a liquid droplet in the element (if one is present in the element) to experience a significant electro-wetting force) or a "non-actuated" state (in which the voltage applied across the element is not sufficient for a liquid droplet in the element (if one is present in the element) to experience a significant electro-wetting force). An element of an EWOD device may be put into the actuated state by applying a voltage difference across the EWOD element having a magnitude that is equal to, or greater than, a threshold voltage $V_{EW}$, whereas if the voltage difference across the EWOD element has a magnitude that is less, or much less than the threshold voltage $V_{EW}$ the element is in its non-actuated state. The threshold voltage $V_{EW}$ is often referred to as an "actuation voltage", and this term is used below. In practice the threshold voltage may typically be determined as the minimum voltage required to effect droplet operations, for example the moving or splitting of droplets. In many cases there is one threshold voltage for droplets to move and a second (higher) threshold voltage for droplets to split, and in such cases the "actuation voltage" is preferably set above the threshold required for droplets to split. In practice the non-actuated state may typically be zero volts.

Typically EWOD systems may be considered to be digital, in that the EWOD elements are programmed either to an actuated state or a non-actuated state. However, the actuation due to electro-wetting is essentially analogue in nature, so the actuation force can be tuned by varying the voltage (up to a certain maximum voltage at which the actuation force saturates). Some performance parameters also depend in an analogue manner on voltage—for example the maximum speed of movement of a droplet is approximately proportional to the applied voltage. It should therefore be understood that an EWOD device may alternatively be operated by supplying analogue input data rather than digital data.

U.S. Pat. No. 6,565,727 (Shenderov, issued May 20, 2003) discloses a passive matrix EWOD device for moving droplets through an array.

U.S. Pat. No. 6,911,132 (Pamula et al., issued Jun. 28, 2005) discloses a two dimensional EWOD array to control the position and movement of droplets in two dimensions.

U.S. Pat. No. 6,565,727 further discloses methods for other droplet operations including the splitting and merging of droplets, and the mixing together of droplets of different materials.

U.S. Pat. No. 7,163,612 (Sterling et al., issued Jan. 16, 2007) describes how TFT based thin film electronics may be used to control the addressing of voltage pulses to an EWOD array by using circuit arrangements very similar to those employed in AM display technologies.

The approach of U.S. Pat. No. 7,163,612 may be termed "Active Matrix Electro-wetting on Dielectric" (AM-EWOD). There are several advantages in using TFT based thin film electronics to control an EWOD array, namely:

Electronic driver circuits can be integrated onto the lower substrate 72

TFT-based thin film electronics are well suited to the AM-EWOD application. They are cheap to produce so that relatively large substrate areas can be produced at relatively low cost TFTs fabricated in standard processes can be designed to operate at much higher voltages than transistors fabricated in standard CMOS processes. This is significant since many EWOD technologies require EWOD actuation voltages in excess of 20V to be applied.

U.S. Pat. No. 7,163,612 does not however disclose any circuit embodiments for realizing the TFT backplane of the AM-EWOD.

EP2404675 (Hadwen et al., published Jan. 11, 2012) describes array element circuits for an AM-EWOD device. Various methods are known for programming and applying an EWOD actuation voltage to the EWOD element electrode. The programming function described includes a memory element of standard means, for example, based on Dynamic RAM (DRAM) or Static RAM (SRAM) and input lines for programming the array element.

Whilst EWOD (and AM-EWOD) devices can be operated with either DC or AC actuation voltages, in practice there are many reasons for preferring an AC method of driving, as reviewed in the previously cited reference R. B. Fair, Microfluid Nanofluid (2007) 3:245-281. It may be noted that droplets can be actuated and manipulated for a wide range of AC driving frequencies ranging typically from a few hertz to several kHz.

One possible method for implementing an AC driving method in an AM-EWOD device is to apply a ground potential to the reference electrode 28. Element electrodes in the array which are programmed such that any droplet present is non-actuated are thus programmed to a ground potential. Array element electrodes 38 in the array that are programmed so that any droplet present is actuated are programmed to alternate between a potential of $V_{EW}$ and $=-V_{EW}$. This method of driving requires that the maximum voltage that must be switched by the transistor elements is $2V_{EW}$.

U.S. Pat. No. 8,173,000 (Hadwen et al., issued May 8, 2012) describes an AM-EWOD device with array element circuit and method for supplying an AC actuation voltage to the electrode. The AC drive scheme described by this patent utilizes the application of AC signals to both the element electrode 38 and to the reference electrode 28 of the device. The unactuated state is achieved by connecting to the element electrode by a low impedance path to an electrical signal which is the same as the electrical signal applied to the reference electrode. Therefore, the device is capable of generating a voltage difference between the electrodes that varies between $+V_{EW}$ and $-V_{EW}$, whilst the transistors in the array element circuit 84 are only ever required to operate with a rail-to-rail voltage of $V_{EW}$.

U.S. Pat. No. 8,653,832 describes how an impedance (capacitance) sensing function can be incorporated into the array element. The impedance sensor may be used for determining the presence and size of liquid droplets present at each electrode in the array.

U.S. Pat. No. 8,221,605 describes a coplanar electrode arrangement wherein the reference electrode is omitted from the top substrate and is replaced by an in-plane reference electrode which is disposed upon the lower substrate along with the drive electrodes. U.S. Pat. No. 8,221,605 discloses how the reference electrode may be comprise a two dimensional grid of conducting lines electrically and physically distinct from the drive electrodes.

U.S. Pat. No. 8,764,958 describes a method for achieving high voltage droplet actuation using low voltage semiconductor fabrication technologies. A bi-state switch enables a drive electrode to be switched so as to be either at a low voltage level or else in a high-impedance state. An AC voltage signal is supplied to a reference electrode.

SUMMARY OF INVENTION

Technical Problem

In U.S. Pat. No. 8,764,958 the actuated state is achieved by setting the element electrode to a low voltage, for example a low DC level. The overall voltage achieved across an element in the actuated state is thus approximately equal to the amplitude of the AC voltage applied to the reference electrode. U.S. Pat. No. 8,764,958 claims that this allows the element electrode always to be at a low voltage, commensurate with the requirements of the transistors in the electronics layer. However U.S. Pat. No. 8,764,958 does not appreciate that, in the event of a droplet being present at the element electrode, the AC signal applied to the reference electrode will couple across the droplet and onto the element electrode. Therefore the electronic circuitry is still subject to high voltages, contrary to the assertions made in U.S. Pat. No. 8,764,958.

Solution to Problem

A first aspect of the invention provides a method of driving an element of an active matrix electro-wetting on dielectric (AM-EWOD) device, the AM-EWOD element having an element electrode and a reference electrode, the method comprising: applying a first alternating voltage to the reference electrode; and addressing the element electrode by any one of applying to the element electrode a second alternating voltage that has the same frequency as the first alternating voltage and that is out of phase with the first alternating voltage and holding the element electrode in a high impedance state.

The "high impedance state" may have an impedance between the element electrode and ground that is of the order of at least 100 Mega-ohm. The "high impedance state" may have an impedance between the element electrode and ground that is of the order of at least 1 Giga-ohm.

When the second alternating voltage is applied to the element electrode the element is put in an actuated state in which the element is configured to actuate any liquid droplet present in the element, while when the element electrode is held in the high impedance state the element is put in a non-actuated state. An element may be put in the actuated state or the non-actuated state as desired by, respectively, applying the second alternating voltage to the element electrode or holding the element electrode in the high impedance state. An element may be switched between the actuated state and the non-actuated state by ceasing to apply the second alternating voltage to the element electrode and holding the element electrode in a high impedance state. An element may be switched between the non-actuated state and the actuated state by ceasing to hold the element electrode in the high impedance state and applying the second alternating voltage to the element electrode.

In the actuated state, the element electrode is connected to a time varying voltage signal which is out of phase with the time varying voltage signal applied to the reference electrode. The time varying voltage signal applied to the element electrode may typically have the same, or a similar, voltage amplitude as the time varying voltage signal applied to the reference electrode. In this case the overall voltage across the element may be approximately twice the amplitude of the time varying voltage signal applied to the reference electrode. This means that a given magnitude of actuation voltage across the element can be obtained while the maximum amplitudes of the time varying voltage signals applied to the electrodes may be reduced, thereby reducing the voltage that is required to be switched in order to change an element from the actuated state to the non-actuated state or vice versa.

The term "alternating" voltage as used herein is not limited to a voltage having a sinusoidal waveform, but is intended to encompass any voltage waveform that varies in a predictable manner between an upper voltage limit and a lower voltage limit. Also, for the avoidance of doubt the term "alternating voltage" as used herein does not exclude the presence of a constant voltage term so that an alternating voltage may have the general form $V(t)=V_0+V_1(t)$ where $V_0$ represents a constant voltage component and $V_1(t)$ is a time varying voltage component (alternating component).

The reference electrode and the element electrode are configured so as to apply a voltage to the element of the EWOD device. For example the reference electrode may be provided on one substrate of the device and the element electrode may be disposed on another substrate of the device, with the substrates facing one another, and with a liquid droplet (if present in the element) being disposed between the substrates. Alternatively, the reference electrode and the element electrode may be disposed on the same substrate of the device as one another, in an in-plane configuration.

The reference electrode and the element electrode are addressable independently from one another.

A second aspect of the invention provides a circuit for selectively providing an alternating voltage to an AM-EWOD element electrode, the circuit having a memory element, an input node for connection to a source of an alternating voltage, an output node for connection to the AM-EWOD element electrode, and a first switch for addressing the output node by, in dependence on a data value stored in the memory element, any one of electrically connecting the input node to the output node and electrically isolating the input node from the output node.

A third aspect of the invention provides an active matrix EWOD device having a plurality of AM-EWOD elements, each element having an element electrode and a reference electrode, the device comprising a reference electrode drive circuit for applying a first alternating voltage to the reference electrode and array element circuits for addressing the element electrode of a respective AM-EWOD element by any one of applying a second alternating voltage to the element electrode of the respective AM-EWOD element and putting the element electrode of the respective AM-EWOD element in a high impedance state, wherein the second alternating voltage has the same frequency as the first alternating voltage and the second alternating voltage is out of phase with the first alternating voltage.

Examples of the invention provide an AM-EWOD device having an array element circuit and a method of driving the array element as follows:

An AC voltage signal is supplied to the reference electrode

The element electrode is configured to be either:

1. Driven by an AC voltage signal in anti-phase to the AC voltage signal applied to the reference electrode, or 2. Arranged to be in a high impedance state.

Configuration 1 defines the actuation state, whereby the array element is configured to actuate any liquid droplet present in its location.

Configuration 2 defines the non-actuation state, whereby the array element is configured so as not to actuate any liquid droplet present in its location.

Advantageous Effects of Invention

The advantages of the invention are that:

By driving the AM-EWOD device in this way, AC electro-wetting is achieved, with the electro-wetting voltage being switched between $+V_{EW}$ and $-V_{EW}$ whilst the transistors in the array element circuit are only required to switch a maximum voltage of $V_{EW}$ This method of driving may be implemented in circuitry requiring a minimal number of transistors (embodiments disclosed include a 2-Transistor array element circuit). Advantages of small array element circuits are:

The size of the array element to be minimized. This in turn facilitates larger format arrays, and also the manipulation of smaller liquid droplets.

Smaller/simpler circuits generally facilitate higher manufacturing yield.

Smaller/simpler circuits may facilitate a device arrangement that has a higher optical transparency, the thin film electronics being only partially transparent. Optical transparency may be important in performing chemical tests which involve a change in the optical properties of the liquid droplet which is then measured Embodiments of the invention can be realized requiring only n-type (or only p-type) transistors in the array element circuit. The AM-EWOD device can thus be fabricated in a single channel transistor manufacturing process.

BRIEF DESCRIPTION OF DRAWINGS

FIG. 2 is a schematic diagram depicting a an AM-EWOD device in schematic perspective in accordance with a first and exemplary embodiment of the invention.

FIG. 3 shows a cross section through some of the array elements of the exemplary AM-EWOD device of FIG. 2.

FIG. 4A shows a circuit representation of the electrical load presented at the element electrode when a liquid droplet is present FIG. 4B shows a circuit representation of the electrical load presented at the element electrode when no liquid droplet is present.

FIG. 5 is a schematic diagram depicting the arrangement of thin film electronics in the exemplary AM-EWOD device of FIG. 2 according to a first embodiment of the invention.

FIG. 6 shows a schematic arrangement of the array element circuit in accordance with a first embodiment of the invention.

FIG. 7 is a schematic diagram depicting the array element circuit for use in the array elements of the exemplary AM-EWOD device of FIG. 2 according to a first embodiment of the invention.

FIG. 8 is a timing diagram showing an exemplary arrangement of the timing signals V1 and V2 for driving the array elements of the exemplary AM-EWOD device of FIG. 2 according to a first embodiment of the invention.

FIG. 9 shows part of an exemplary AM-EWOD device of FIG. 2 in plan-view and an exemplary arrangement of a liquid droplet and element electrodes.

FIG. 10 is a timing diagram showing an exemplary arrangement of timing signals applied to the voltage signal inputs of array element circuits of the AM-EWOD device according to a first embodiment of the invention.

FIG. 11 is a timing diagram showing an exemplary arrangement of timing signals applied to the voltage signal inputs of array element circuits of the AM-EWOD device according to a second embodiment of the invention.

FIG. 12 is a schematic diagram depicting the array element circuit for use in the array elements of the exemplary AM-EWOD device of FIG. 2 according to a third embodiment of the invention.

FIG. 13 is a schematic diagram depicting the array element circuit for use in the array elements of the exemplary AM-EWOD device of FIG. 2 according to a fourth embodiment of the invention.

FIG. 14 is a schematic diagram depicting the array element circuit for use in the array elements of the exemplary AM-EWOD device of FIG. 2 according to a fifth embodiment of the invention.

FIG. 15 is a schematic diagram depicting the array element circuit for use in the array elements of the exemplary AM-EWOD device of FIG. 2 according to a sixth embodiment of the invention.

FIG. 16 shows exemplary capacitance versus voltage characteristics of an active capacitor device as contained within the array element circuit of a sixth embodiment of the invention.

FIG. 17 is a schematic diagram depicting the array element circuit for use in the array elements of the exemplary AM-EWOD device of FIG. 2 according to a seventh embodiment of the invention.

FIG. 18 is a schematic diagram depicting the array element circuit for use in the array elements of the exemplary AM-EWOD device of FIG. 2 according to an eighth embodiment of the invention.

FIG. 19 is a schematic diagram depicting the array element circuit for use in the array elements of the exemplary AM-EWOD device of FIG. 2 according to a ninth embodiment of the invention.

FIG. 20 is a schematic diagram depicting the array element circuit for use in the array elements of the exemplary AM-EWOD device of FIG. 2 according to a tenth embodiment of the invention.

FIG. 21 shows a schematic arrangement of the array element circuit in accordance with an eleventh embodiment of the invention.

FIG. 22 is a schematic diagram depicting the arrangement of thin film electronics in the exemplary AM-EWOD device of FIG. 2 according to an eleventh embodiment of the invention.

FIG. 23 is a schematic diagram depicting the array element circuit for use in the array elements of the exemplary AM-EWOD device of FIG. 2 according to an eleventh embodiment of the invention.

DESCRIPTION OF EMBODIMENTS

Figure 1:
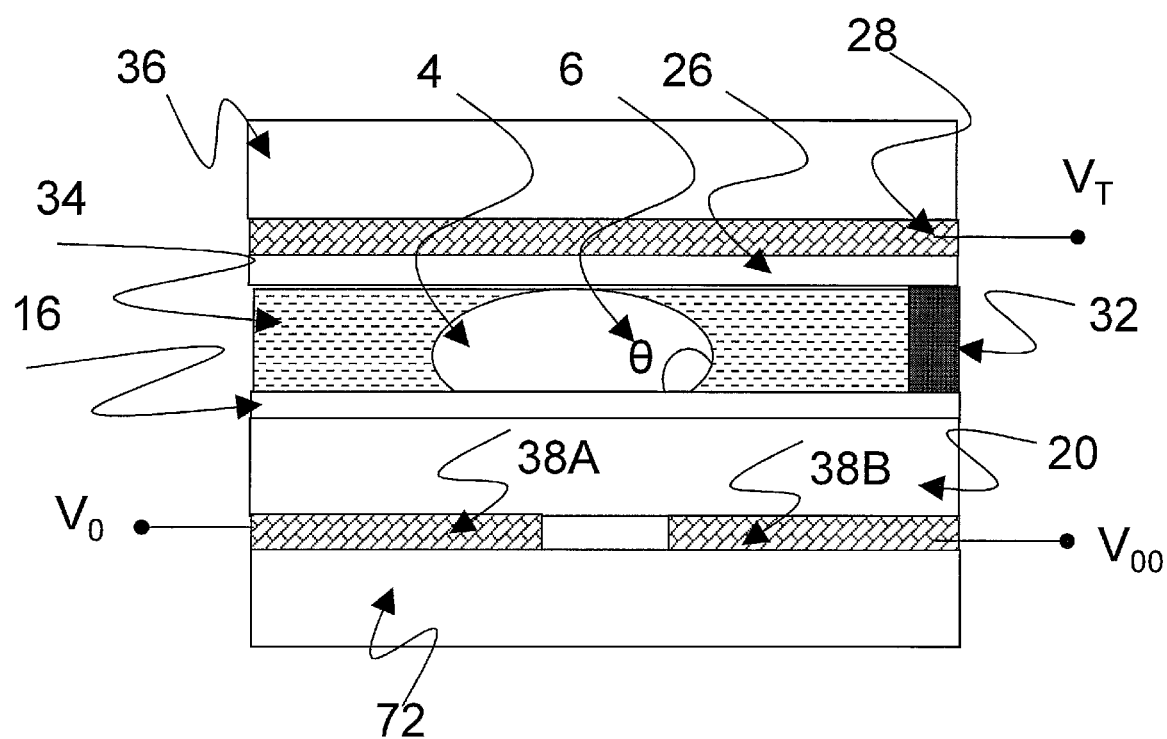
FIG. 1 is a schematic diagram depicting a conventional EWOD device in cross-section.

In the annexed drawings, like references indicate like parts or features.

FIG. 2 is a schematic diagram depicting an AM-EWOD device in accordance with an exemplary embodiment of the present invention. The AM-EWOD device has a lower substrate 72 with thin film electronics 74 disposed upon the lower substrate 72. The thin film electronics 74 are arranged to drive the array element electrodes 38. A plurality of array element electrodes 38 are arranged in an electrode array 42, having X by Y elements where X and Y may be any integer. A liquid droplet 4 which may consist of any polar liquid and which typically may be ionic and/or aqueous in nature, is enclosed between the lower substrate 72 and a top substrate 36, although it will be appreciated that multiple liquid droplets 4 can be present. A non-polar fluid 34 is used to fill the space between the substrates and may consist of an oil (for example dodecane, silicone oil or other alkane oil) or may be air.

FIG. 3 is a schematic diagram depicting a pair of the array elements 38A and 38B in cross section that may be utilized in the AM-EWOD device of FIG. 3. The device configurations is similar to the conventional configuration shown in FIG. 1, with the AM-EWOD device further incorporating the thin-film electronics 74 disposed on the lower substrate 72. The uppermost layer of the lower substrate 72 (which may be considered a part of the thin film electronics layer 74) is patterned so that a plurality of the array element electrodes 38 (e.g. specific examples of reference electrodes are 38A and 38B in FIG. 4) are realized. These may be termed the array element electrodes 38. The term array element electrode 38 may be taken in what follows to refer both to the physical electrode structure 38 associated with a particular array element, and also to the node of an electrical circuit directly connected to this physical structure. The reference electrode 28 is shown in FIG. 3 disposed upon the top substrate but may alternatively be disposed upon the lower substrate 72 to realize an in-plane reference electrode 28 geometry. The term reference electrode 28 may also be taken in what follows to refer to both or either of the physical electrode structure and also to the node of an electrical circuit directly connected to this physical structure. The electro-wetting voltage may be defined as the difference in voltage between the element electrode 38 and the reference electrode 28.

FIG. 4A shows a circuit representation of the electrical load 40A between the element electrode 38 and the reference electrode 28 in the case where a liquid droplet 4 is present. The liquid droplet 4 can usually be modelled as resistor and capacitor in parallel. Typically the resistance of the droplet will be relatively low (e.g. if the droplet contains ions) and the capacitance of the droplet will be relatively high (e.g. because the relative permittivity of polar liquids is relatively high, e.g. ~80 if the liquid droplet is aqueous). In many situations the droplet resistance is relatively small and so at the frequencies of interest for electro-wetting the liquid droplet 4 may function effectively as an electrical short circuit. The hydrophobic coatings 16 and 26 have electrical characteristics that may be modelled as capacitors and the insulator 16 may also be modelled as a capacitor. The overall impedance between the element electrode 38 and the reference electrode 28 may be approximated by a capacitor whose value is typically dominated by the contribution of the insulator 20 and hydrophobic coatings 16 and 26 contributions, and which for typical layer thicknesses and materials may be of order a pico-Farad in value.

FIG. 4B shows a circuit representation of the electrical load 40B between the element electrode 38 and the reference electrode 28 in the case where no liquid droplet 4 is present. In this case the liquid droplet 4 components are replaced by a capacitor representing the capacitance of the non-polar fluid 34 which occupies the space between the top and lower substrates. In this case the overall impedance between the element electrode 38 and the reference electrode 28 may be approximated by a capacitor whose value is dominated by the capacitance of the non-polar fluid and which is typically small, of order femto-Farads.

For the purposes of driving and sensing, the electrical load 40 overall functions in effect as a capacitor, whose value depends on whether a liquid droplet 4 is present or not at a given element electrode 38. In the case where a droplet is present, the capacitance is relatively high (typically of order pico-Farads) whereas if there is no liquid droplet 4 present the capacitance is low (typically of order femto-Farads). If a droplet partially covers a given electrode 38 then the capacitance may approximately represent the extent of coverage of the element electrode 38 by the liquid droplet 4.

FIG. 5 is a schematic diagram depicting an exemplary arrangement of thin film electronics 74 upon the lower substrate 72. Each element of the electrode array 42 contains an array element circuit 84 for controlling the electrode potential of a corresponding element electrode 38. Integrated row driver 76 and column driver 78 circuits are also implemented in thin film electronics 74 to supply control signals to the array element circuit 84.

A serial interface 80 may also be provided to process a serial input data stream and facilitate the programming of the required voltages to the element electrodes 38 in the array 42. This may for example consist of logic circuitry to supply timing signals to the row driver 76 and column driver circuits and to supply serial input data to the column driver circuits. The logic circuitry may for example be configured to arrange the sequential addressing of column elements of the column driver circuits in order to preload data onto column addressing lines. Following the programming of all the rows to be addressed, the row driver 76 may be activated to write the data to the array elements. This may all be implemented using standard techniques for array addressing, as for example are very well known in displays and image sensor technologies.

A voltage supply interface 83 provides the corresponding supply voltages, top substrate drive voltages, and other requisite voltage inputs as further described herein. The voltage supply interface may for example supply DC voltages using well-known circuits such as DC-DC convertors, regulators and de-coupling circuits of standard means. Alternatively the DC voltages required may be generated externally and supplied directly to the AM-EWOD device. The voltage supply interface may also be used to level shift input signals to the required voltage levels using level shift circuits which may be of a standard design. Typically timing signals may be input to the AM-EWOD device having a standard 3.3V or 5V amplitude and be level shifted to the requisite voltage levels by level shift circuitry incorporated into the voltage supply interface. For example the V1 and V2 signals later referred to may be generated on the AM-EWOD device by level shifting 5V reference signals supplied to the AM-EWOD device. Alternatively V1 and V2 may be supplied directly to the AM-EWOD device from external drive electronics. A reference electrode drive circuit 85, for supplying a voltage signal to the reference electrode may be incorporated into the TFT electronics. Alternatively this may be supplied from external drive electronics.

The number of connecting wires 82 between the lower substrate 72 and external drive electronics, power supplies etc. can be made relatively few, even for large array sizes. Optionally the serial data input may be partially parallelized, for example if 2 data input lines are used the first may supply data for columns 1 to X/2 and the second for columns (1+X/2) to M with minor modifications to the column driver 78 circuits. In this way the rate at which data can be programmed to the array is increased, a standard technique used in Liquid Crystal Display driving circuitry.

Generally, an exemplary AM-EWOD device that includes thin film electronics 74 is configured as follows. The AM-EWOD device includes a reference electrode 28 (which, optionally, could be an in-plane reference electrode 28) and a plurality of array elements, each array element including an array element electrode (e.g., array element electrodes 38).

Relatedly, the AM-EWOD device is configured to perform a method of controlling an actuation voltage to be applied to a plurality of array elements. The AM-EWOD reference electrode 28 and a plurality of array elements, each array element including an array element electrode 38. The actuation voltage at each array element is defined by a potential difference between the array element electrode 38 and the reference electrode 28. The method of controlling the actuation voltage includes the steps of supplying a voltage to at least a portion of the array element electrodes 38, and supplying a voltage signal to the reference electrode 28 using, for example a reference electrode drive circuit.

FIG. 6 is a schematic diagram showing an example arrangement of thin film electronics 74 in the array element circuit 84. The array element circuit 84 may contain an actuation circuit 46, having inputs nodes ENABLE, DATA and ACTUATE and an output which is connected to an element electrode 38.

The array element circuit 84 may typically perform the functions of:

(i) Programming data to a memory element contained within the actuator circuit and storing the data. The data to be programmed is typically input by means of an addressing line DATA which may be common to all elements within the same column of the array. The programming of data may typically be controlled by an addressing line ENABLE, which may typically be common to all elements within the same row of the array (ii) Supplying a voltage signal to the array element electrode 38, for example as supplied by the input signal V1 which is supplied to input ACTUATE, or alternatively switching the element electrode 38 to a high impedance state.

FIG. 7 shows a design of array element circuit 84 according to a first embodiment of the invention. The electrical load 40 and reference electrode 28 play a role in the operation of the circuit and are also shown in FIG. 7. The array element circuit 84 contains transistors 52 and 54, and a capacitor 56. The array element circuit 84 is connected as follows. The drain of transistor 52 is connected to the DATA input which may be common to all array elements in the same column of the array. The control terminal (that is, the gate) of transistor 52 is connected to the ENABLE line which may be common to all elements in the same row of the array. The source of transistor 52 is connected to the control terminal (that is, the gate) of transistor 54. Capacitor 56 is connected between the gate of transistor 54 and a DC bias voltage VDD. The drain of transistor 54 is connected to a voltage input ACTUATE which is common to all elements within the array. The source of transistor 54 is connected to the output node of the array element circuit 84 which in turn is connected to the element electrode 38.

The operation of the array element circuit 84 is described as follows. The circuit performs two functions, a memory function and an actuation function. The memory function is explained as follows. Transistor 52 and capacitor 56 between them function as a memory element, in this example a Dynamic RAM (DRAM) memory element, capable of programming and storing data within the array element circuit 84. To program data, a voltage is programmed onto the column addressing line DATA. The ENABLE line is then taken high to switch transistor 52 on. The voltage on DATA is then programmed onto capacitor 56 and held there once ENABLE is taken low, irrespective of the input voltage DATA. In typical operation, the programmed voltage may be digital and be approximately $0.5 \times V_{EW}$ (for programming a "1") or $-0.5 \times V_{EW}$ Volts (for programming a "0").

The actuation function is explained as follows. The element electrode 38 is connected to an output node of the array element circuit 84 The array element circuit 84 has a switch (in this example embodied as transistor 54) for, in dependence on a data value stored in the memory element of the circuit, either electrically connecting the input node (ACTUATE node) to the output node (so that a voltage applied to the input node (ACTUATE node) of the circuit is supplied to the element electrode) or electrically isolating the input node (ACTUATE node) from the output node.

An AC voltage signal V1 (corresponding to the "second alternating voltage" of claim 1) is applied to the ACTUATE node which acts as an input node of the circuit 84 and an AC voltage signal V2 (corresponding to the "first alternating voltage" of claim 1) is applied to the reference electrode 28. V1 and V2 are arranged to be out of phase with one another, and optionally and advantageously to be substantially in anti-phase. When the switch (transistor 54) connects the input node (ACTUATE node) to the output node the AC voltage signal V1 at the ACTUATE node is supplied to the element electrode 38. The phase difference between V1 and V2, as well as their voltage amplitudes, will determine the actuation force experienced by the droplet, since the voltage across the droplet is the difference between the voltage applied to the element electrode 38 and the voltage applied to the reference electrode 28, that is V1-V2. Consider for example the following two cases:

(1) V1 and V2 are 180 degrees out of phase:
In this example, V1-V2 switches between $+V_{EW}$ and $-V_{EW}$ depending on whether V1 or V2 is high. In this exemplary case the actuation force is maximised therefore (2) V1 and V2 are 90 degrees (or 270 degrees) out of phase:
In this example, for 25% of the time V1 and V2 are both high, V1-V2=0 Volts and there is no actuation, for 25% of the time V1 and V2 are both low and V1-V2=0 Volts and there is no actuation, for 25% of the time V1-V2=+$V_{EW}$ and for 25% of the time V1-V2=-$V_{EW}$. In this exemplary case the actuation is 50% of the maximum therefore.

It can therefore be seen that it is desirable that V1 and V2 are close to 180 degrees out of phase with one another (that is, are substantially in anti-phase with one another) so as to maximise the actuation force, but that this is not essential since a non-zero actuation force is provided even if V1 and V2 are only 90 degrees out of phase with one another. V1 and V2 may for example be between 90 degrees and 270 degrees out of phase with one another, they may be between 135 degrees and 225 degrees out of phase with one another, or they may be between 157.5 degrees and 202.5 degrees out of phase with one another.

Similarly, the actuation force will be reduced if V1 and V2 do not have the same frequency as one another, as the phase difference between V1 and V2 would then vary over a period for which V1 is applied to one electrode and V2 is applied to the second electrode. In many implementations V1 and V2 will be derived from the same source, and may therefore be assumed to have the same frequency as one another. However, it is not essential for V1 and V2 to have the same frequency as one another, since a non-zero actuation force may be provided even if V1 and V2 should have a varying phase difference.

An example arrangement of voltage signals V1 and V2 is shown in FIG. 8. Each of V1 and V2 are switched between a low level of $-0.5 \times V_{EW}$ Volts and a high level of $0.5 \times V_{EW}$, V1 is high when V2 is low and vice versa. The element electrode 38 is actuated when a "1" is programmed to the memory (a voltage of $0.5 \times V_{EW}$ programmed to the gate of transistor 54). In this case transistor 54 is turned on and so voltage signal V1 is transmitted to the element electrode 38. The voltage developed across the electrical load 40 (the electro-wetting voltage) is therefore V1-V2 which is an AC voltage waveform that varies in time between $-V_{EW}$ and $+V_{EW}$. Typically, for actuation of the droplet by means of electro-wetting, the frequency of the AC waveform may be between 1 Hz and 10 kHz or between 10 Hz and 1 kHz or around 100 Hz. Optionally, it is also possible to actuate the droplet at higher frequencies, for example between 10 kHz and 10 MHz. In this case electric field is dropped through the body of the liquid droplet 4 and the actuation mechanism is through dielectrophoresis rather than electro-wetting. In respects other than the frequency of V1 and V2, the construction of the device and basic principles of operation are the same for dielectrophoresis actuation as for actuation by electro-wetting. In the description of this and other embodiments an EWOD device may be regarded as a device capable of actuation liquid droplets 4 by means of either the electro-wetting or dielectrophoretic force.

The element electrode 38 is non-actuated when a "0" is programmed to the memory (a voltage of $-0.5 \times V_{EW}$ programmed to the gate of transistor 54). In this case transistor 54 is turned off, thereby isolating the output node of the circuit 84, and hence the element electrode 38, from the input node (ACTUATE node). The element electrode 38 therefore exists in a high impedance state. For example the impedance presented at the element electrode 38 comprises (a) A real part, consisting of the leakage current through transistor 54 (which is turned off);

(b) An imaginary part, consisting of parasitic capacitances, e.g. the source to gate capacitance of transistor 54.

Both the real and imaginary parts of the impedance are large, for example typically of a Giga-ohm or more. Therefore the potential of the electrode 38 is substantially unaffected by subsequent changes in the potential at other nodes of the circuit (for example the signal ACTUATE at the drain of transistor 54) whilst transistor 54 remains switched off and the electrode 38 remains in the high impedance state.

We must consider the different cases where (1) a droplet is present at the element electrode 38 (the electrical load 40A is as FIG. 4A) and (2) no droplet is present at the element electrode 38 (the electrical load 40B is as FIG. 4B).

CASE 1—Droplet present: Where a droplet is present, the dominant electrical coupling of the element electrode 38 is to the reference electrode 28 via the electrical load 40. As previously explained, the electrical load in this case 40A may be approximated by a capacitor whose value is of order a pico-Farad. The capacitance of the electrical load 40A will then dominate over other parasitic impedances in the circuit (e.g. that associated with the source-gate capacitance of transistor 54). The electrical potential of the element electrode 38 will therefore track the potential of the reference electrode 28, and will thus correspond to a good approximation to the voltage signal V2. This being the case, the potential developed between the element electrode 38 and the reference electrode 28 will approximately be zero. The liquid droplet 4 will therefore be in a non-actuated state, the contact of the liquid droplet 4 with the hydrophobic coating 16 will not be energized and the liquid droplet 4 will not experience an electro-wetting force.

CASE 2—No droplet present: When no liquid droplet 4 is present, the capacitance between the element electrode 38 and the reference electrode 28 is very small as previously explained. The element electrode 38 is therefore now in a high impedance state and its effective potential is only poorly defined, being dependent on the multiple small parasitic capacitances and resistances within the circuit (e.g. the small electrical load 40B capacitance to the reference electrode 28, the small parasitic source to gate capacitance of transistor 54, and the large off resistance of transistor 54). It may therefore appear unclear what the effective potential of the element electrode 38 is and therefore the extent to which the element electrode 38 remains effectively non-actuated.

However after careful consideration the inventors have realised that the situation is such that, even with the potential of the element electrode 38 being poorly defined in CASE 2, the device can still support the correct transport of liquid droplets 4. Consider the situation shown in FIG. 9, where part of an AM-EWOD device in plan-view is shown. Consider the case where element electrode 38A is programmed so as to be actuated and element electrode 38B is programmed so as to be non-actuated. A liquid droplet 4 resides in the neighborhood of array element electrode 38A. The array element associated with electrode 38B is in the situation described by CASE 2 above. Suppose, for the sake of argument, that the poorly defined potential of electrode 38B were to result in some electro-wetting actuation and that the liquid droplet 4 is therefore attracted, and starts to move towards, element electrode 38B. In this situation, as the liquid droplet 4 gets closer (or begins to overlap) element electrode 38B, an appreciable capacitance starts to be developed between the reference electrode 28 and element electrode 38B, mediated by the capacitive coupling effect of the liquid droplet 4 which cause the capacitance of the load circuit 40 at element electrode 38B to increase. With a significant increase in the capacitance between the reference electrode 28 and element electrode 38B, the potential of the element electrode 38B approximates to that of the reference electrode 28 by capacitive coupling. In other words the situation begins to resemble more closely CASE 1 than CASE 2. The overall effect is that the liquid droplet is now repelled away from element electrode 38B and would move back towards element 38A.

The inventors have accordingly realised that there thus exists, associated with this method of driving, an in-built correction mechanism. It is unimportant that in the absence of any liquid droplet 4, the non-actuated state of an array element is poorly defined, because upon the arrival of a liquid droplet into the location of this array element, the non-actuated state becomes well defined again and, providing that a neighboring array element is actuated, any droplet will move away from the non-actuated state by the electro-wetting effect.

For operation of the array element circuit 84 in CASE 2, it is preferable that the potential of the element electrode 38 is substantially the same as the potential of the reference electrode 28 at the instant where transistor 54 is switched off and the element electrode 38 goes into a high impedance state. Therefore the element electrode 38 should preferably be pre-charged to the same potential (or substantially the same potential) as V2 prior to switching into the high impedance state. In the case where the array element is actuated, this pre-charging has no effect, since transistor 54 becomes switched on and the array element electrode is connected to the signal V1 which is applied to ACTUATE. In the case where the array element is non-actuated, the pre-charge is advantageous as it enables the starting DC potential of the element electrode 38 to be controlled. By pre-charging the element electrode 38 in this way, it is ensured that during operation there is no DC offset between the potential of the reference electrode 28 and the potential of the high impedance element electrode 38. Avoiding any DC offset voltage may be important and advantageous both for avoiding unwantedly attracting liquid droplets 4 onto the array element by means of a parasitic electro-wetting effect occasioned by any DC offset voltage, and also for avoiding operating with a DC bias across the insulator 20 and hydrophobic coating 16. It is well known that having a DC offset voltage can compromise device reliability, e.g. by encouraging ion migration through the insulator 20 or by trapping charge in the hydrophobic coating 16. Hence it is advantageous to avoid operating the device with any DC offset voltage.

To pre-charge the element electrode 38 to the same potential as V2 as described, the voltage signal V1 applied to ACTUATE should be the same as the voltage at V2 at the moment transistor 54 is switched off. This condition ensures that no DC offset potential is programmed between the element electrode 38 and the reference electrode 28 at the time when the element electrode 38 goes to a high impedance state. An example arrangement for the timings applied to the reference electrode 28 (V2), the input ACTUATE (V1) and example addressing lines ENABLE for different rows of the array is shown in FIG. 10. V2 is an AC waveform that is at some times $-0.5 \times V_{EW}$ and at some times $+0.5 \times V_{EW}$ and whose period may be adjusted. To implement electro-wetting in the actuated state, ACTUATE is the logical inverse of V2. However an exception is made at the times when data is programmed to the array, to allow for the requirement that ACTUATE must be at the same potential as V2 at the instant at which transistor 54 is turned off (in the case where a "0" is programmed to the array element). As shown in FIG. 10, ACTUATE is taken into the same state as V2 at around the times of the ENABLE rising edges, which corresponds to the time at which capacitor 56 is charged/discharged and the potential at the gate of transistor 54 is determined.

An advantage of the array element circuit 84 and method of driving described in this embodiment is that the electro-wetting voltage in the actuated state is switched between $+V_{EW}$ and $-V_E W$. Therefore AC electro-wetting is implemented. This is achieved whilst only requiring the array element circuit 84 to switch approximately $V_{EW}$ between the terminals of any transistor in the circuit (for the reasons why this may only be approximate see the discussion below). This is an important advantage of the invention, since typically electro-wetting requires relatively high voltages to actuate the liquid droplets, whilst typical electronics technologies for realizing the thin film electronics 74 impose limitations on the maximum voltage applied to the transistors (e.g. due to reliability concerns).

It should be noted that the application of AC voltage waveforms at both the ACTUATE input and to the reference electrode 28 is crucial to realizing this advantage. It may also be noted that the above advantage would not be realized in the case where an AC voltage was only applied to the reference electrode 28 as is now described. Such a method of driving would not therefore be suitable for a thin film electronics process whose maximum voltage is approximately $V_{EW}$.

By way of explanation, consider the exemplary case where V2 is an AC voltage varying between $-V_{EW}$ and $+V_{EW}$ and V1 is a DC supply, e.g. 0 Volts. Although it may be possible to drive the device in this way, the maximum voltage applied to transistor 54 would still be $2V_{EW}$. This may be shown for the situation where the array element is non-actuated and a liquid droplet 4 is present at a given array element. Here V2 is coupled through the electrical load 40A and so therefore the potential of the element electrode 38 is also substantially equal to signal V2, i.e. varying between $-V_{EW}$ and $+V_{EW}$. In order to operate the circuit under these conditions, it is necessary that in the non-actuated state transistor 54 is maintained switched off whatever the potential at the element electrode 38. In order to achieve this, the potential stored by the DRAM memory element (and so at the gate of transistor 54) would have to be programmed to be no greater than $-V_{EW}$. In this situation, we therefore see that a gate to source voltage of $2V_{EW}$ is developed across transistor 54 at times when V2 is at the high level ($+V_{EW}$). Although it may be possible to drive the device in this way, the maximum voltage applied to transistor 54 would still be $2V_{EW}$. And so this method of driving would be unsuitable for a low voltage TFT electronics process.

A further advantage of this embodiment is that the array element circuit 84 has been implemented with only two transistors and one capacitor. This 2-transistor design is therefore much simpler than array element circuits in prior art (e.g. as disclosed in U.S. Pat. No. 8,173,000) which typically require many more transistors within the array element circuit 84 and may also typically have a greater number of row or column addressing lines. Reducing the complexity and the number of transistors in the array element circuit 84 is advantageous for several reasons

- Smaller array elements/element electrodes may be realized. Typically it is often the case that the minimum achievable array element size is set by the limitations of the thin film electronics and the design for fabrication requirements (design rules) dictating the layout of the array element circuit 84 in thin film electronics. A simpler circuit (fewer transistors) therefore enables smaller array elements to be designed and fabricated. Smaller array elements may be advantageous for at least three reasons. Firstly, smaller liquid droplets may be manipulated. This is particularly important for applications involving the manipulation or analysis of single cells or single molecules. Secondly, if using larger liquid droplets, sub-droplet resolution of actuation may be achieved. This may improve the capabilities of the device, e.g. enabling more accurate splitting or faster mixing. Thirdly, smaller array element sizes facilitate the design and fabrication of very large format array which may have a total number of array elements in excess of 1 million and which may be able to manipulate tens to hundreds of thousands of droplets simultaneously and independently
- A smaller and simpler design of array element circuit 84 may facilitate increased manufacturing yield and hence lower cost of the device
- A smaller and simpler design of array element circuit 84 may facilitate increased optical transparency of the device. This may be important, for example, if the device is being used to implement chemical or biochemical tests that result in a change in the optical properties (e.g. fluorescence, absorbance) of one or more liquid droplets and that by measurement of this change in optical property the device may be read out
- Smaller and simpler design of array element circuit 84 may free up space within the array element to implement other electronic functions into the array element, e.g. temperature sensing, bio-sensing etc
- The array element circuit 84 of this embodiment may be implemented with only n-type transistors. Since it is known that row and column addressing circuits may also be implemented also in only n-type transistors, it is possible for the AM-EWOD device to be fabricated in a single channel process (n-type only). Compared to a Complementary process (which has both n- and p-type transistors), a single channel process may be considerably lower cost. With a single channel process it also becomes possible to fabricate the AM-EWOD device in manufacturing processes that only support single channel transistors, e.g. standard display processes for the fabrication of amorphous silicon (a-Si), zinc oxide (ZnO) or Indium Gallium Zinc Oxide processes.

A further advantage of this embodiment is that the addressing signal ACTUATE is common to all elements within the array. This has the advantage of simplifying the circuitry required to drive ACTUATE which may be external to the AM-EWOD device, or optionally, implemented in thin film electronics. A further advantage is that by making ACTUATE a global signal, the addressing line may be shared between adjacent rows or adjacent columns of the array. This may simplify circuit layout and reduce the physical size of the array element still further.

Previously in the description it was stated that, according to this method of driving the device, the maximum voltage required to be switched by any transistor was approximately equal to $V_{EW}$. In some circumstances it may be necessary for the voltage switched by the transistors to slightly exceed $V_{EW}$, since commonly transistors may have a non-zero turn on potential (threshold voltage). For example, considering the operation of the embodiment as described above, if the threshold voltage of transistor 54 is Vth, to ensure that transistor 54 is fully turned on in the actuation state it is necessary for the potential at the gate of transistor 54 to be programmed to $0.5 \times V_{EW}+$Vth. Likewise, when programming the DRAM circuit by means of activating the ENABLE signal, it is necessary for a voltage of $0.5 \times V_{EW}+$Vth to be loaded onto the input line DATA. Since the threshold voltage of transistor 52 may also be Vth, the voltage high level applied to ENABLE must be $0.5 \times V_{EW}+$2Vth. Therefore, we see overall that the maximum voltage handling capability of the thin film electronics must be $V_{EW}+$2Vth. Typically Vth may be ~2 Volts, whilst $V_{EW}$ is of order 20V. Therefore it is still very advantageous to implement methods whereby the maximum voltage is required to be $V_{EW}+$2Vth rather than $2V_{EW}$.

In the description of the operation of the device according to this embodiment, the AC voltage pulses V1 and V2 were described as being square waves of equal amplitude and not offset from one another by a DC potential. It will be appreciated that modifications to this are possible without departing from the spirit and scope of the invention, for example V1 and V2 could be sinusoidal or triangular waveforms, V1 could have a different amplitude to V2 and/or one or other of V1 or V2 could be offset from one another by a DC potential.

A particularly advantageous implementation of the invention may be to design transistor 54 to have a low leakage (off) current. An example implementation of a low leakage transistor architecture is a Lightly Doped Drain (LDD) design. LDD is a well-known technique whereby the leakage (off) characteristics and/or parasitic gate to source capacitance of a transistor may be reduced, albeit at some cost in device mobility/switching speed. In the case of this embodiment of the invention, the advantages of LDD may be very beneficial to the operation of the circuit, in particular for defining the non-actuated state. By minimizing both DC leakage current through transistor 54 and also the capacitance between the source and gate of transistor 54, the element electrode 38 is more subject to control from the reference electrode 28 (as is desirable) than from parasitic interactions with the rest of the array element circuit 84. Similarly, since transistor 52 also functions as a switch device, it may also be advantageous to implement this transistor as a lightly doped drain device, exploiting the low leakage characteristics so that the voltage programmed onto the gate of transistor 54 is well maintained after transistor 52 is switched off, since leakage through transistor 52 is minimized.

An AM-EWOD device according to a second embodiment of the invention is as the first embodiment except that the addressing signal V1 applied to ACTUATE is no longer a global signal but is independent for each row of the array.

The operation of the device according to this embodiment is identical to as previously described, except that the timings for the signals V1 are determined on a row-by-row basis. In the following description the notation V1<N> is used to describe the addressing signal applied to ACTUATE for the Nth row of the array.

FIG. 11 shows example timing signals for this embodiment. These are as for the first embodiment, except that the addressing line ACTUATE is driven differently for each row of the array (e.g. V1<1>, V1<2>). According to this embodiment, the requirement to switch the voltage of ACTUATE to the same as V2 is only necessary for the V1 signal of the particular row being addressed. This has advantages over the first embodiment in that the interruption in the electrowetting actuation (which occurs when V1 is switched to the same potential as V2) is minimized, since actuation is not interrupted on the rows of the array that are not being addressed at that particular time.

An AM-EWOD device according to a third embodiment of the invention is as the first or second embodiments with an alternative design of array element circuit 84 as shown in FIG. 12. The array element circuit 84 contains an additional transistor 90, the source of which is connected to the element electrode 38 the drain of which is connected to ACTUATED and gate of which are connected to an input line PRE. The input line PRE may be common to all elements within the array, or else common to all elements in the same row of the array, or else common to all elements in the same column of the array.

The function of the additional transistor 90 is to facilitate pre-charging of the element electrode 38, prior to programming the element electrode 38 into either the actuated or non-actuated state. The pre-charging may be implemented by taking input PRE high for a short time. Transistor 90 is in effect connected as a diode, and taking PRE to a high voltage level will forward bias the diode so that the element electrode 38 is pre-charged to the voltage level of the input ACTUATE. In order to pre-charge so that no DC offset voltage is programmed between the element electrode 38 and the reference electrode 28, the signal ACTUATE should be at the same potential as V2 at the time of pre-charging, as previously explained.

An advantage of this embodiment compared to the first embodiment is that the DC potential of the element electrode 38 in CASE 2, set at a time just before the element electrode 38 is switched into a high impedance state, can be defined independently of the operation of the DRAM memory within the array element circuit 84, since the pre-charge operation does not depend on the timings. Therefore, in the case of the second embodiment, it does not matter whether the signal at ACTUATE is at high or low level at the time when the array element is programmed. Such a means of pre-charging may be effective if the capacitance at the element electrode 38 is small, as will generally be the case when no liquid droplet is in the vicinity of the array element. Since pre-charging can be implemented independently of programming data to the array, the pre-charging operation can be implemented more frequently. The circuit is therefore less vulnerable to the parasitic leakage of charge from the element electrode 38 when transistors 90 and 54 are switched off.

Advantageously, this may also facilitates a greater flexibility in the timing signals for ACTUATE, which may be especially advantageous if ACTUATE is common to each element within the same row of the array.

A further advantage of this embodiment is that the implementation of the pre-charge function has been implemented by means of only one additional transistor in the circuit. A further advantage is that the pre-charge operation may be implemented on a line-by-line basis.

The third embodiment has been described for the case where the input signal connected to the drain of transistor 90 is the input line ACTUATE. This implementation is advantageous since there is no need for a separate addressing line, and the size of the array element circuit 84 may be small. It will be appreciated however that the ideas of the third embodiment could equally be implemented with a different signal applied to the drain of transistor 90. This could optionally be the input signal PRE, or another, independent input signal.

A fourth embodiment of the invention is as the first embodiment with an alternative array element circuit 84 as shown in FIG. 13. The array element circuit 84 is as the first embodiment except that it also contains an additional capacitor 108 connected between the element electrode 38 and a DC supply VDD. The purpose of the capacitor 108 is to ensure that the DC voltage level programmed onto the element electrode 38 is well maintained even in the case where there may be significant leakage current through transistor 54. The leakage of charge through transistor 54 may be deleterious to circuit operation since it may result in a change of the DC potential of the element electrode 38. This may in turn result in the development of a DC potential between the element electrode 38 and the reference electrode 28, undesirable for reasons previously explained. The presence of the additional capacitor 108 in the circuit helps to maintain the DC potential of the element electrode 38 when it is switched into the high impedance state, by storing the pre-charged potential at this node.

An AM-EWOD device according to a fifth embodiment of the invention is as any of the previous embodiments with an alternative design of array element circuit 84 as shown in FIG. 14. The array element circuit 84 is as for the first embodiment but also contains an additional capacitor 94 which is connected between the gate of transistor 54 and the input ACTUATE. The purpose of capacitor 94 is to provide a boost to the voltage programmed at the gate of transistor 54. The operation of the array element circuit 84 is similar to previous and is described as follows:

- During the programming of data to the array element, V1 and V2 must both be taken to low level
- Data is programmed to the DRAM memory in the array element. The input signal to be programmed is firstly pre-programmed onto line DATA. ENABLE is then taken high and the signal on DATA is programmed to the gate of transistor 54 and stored on capacitor 56. Transistor 52 is then switched off
- In the case where a "0" is programmed, transistor 54 is turned off and the element electrode 38 is switched into a high impedance state
- In the case where a "1" is programmed, transistor 54 is turned on and the input signal V1 is connected through to the element electrode 38. At the time when signal V1 goes high, the capacitive coupling between ACTUATE and the gate of transistor 54, results in the voltage signal at the gate of transistor 54 being boosted by injection of charge across capacitor 94.

The effect, and advantage of the inclusion of capacitor 94 within the circuit and the boost operation, is that in order to program the "1" state it is no longer necessary to program the voltage at the gate of transistor 54 to be a threshold voltage above the high level voltage signal of ACTUATE (i.e. to $0.5 \times V_{EW} + Vth$) this is because the boost operation raises the potential of the gate of transistor 54 by an additional amount, which may be arranged (e.g. by careful design of the size of capacitor 94) to be approximately Vth. This is sufficient to ensure that transistor 54 remains turned on when V1 is taken to $+0.5 \times V_{EW}$. Depending on the sizing of the circuit capacitances, this may be true even in the case where the voltage originally programmed to the gate of transistor 54 was $0.5 \times V_{EW}$ or less, because of the boost effect.

By careful design choice of the value of capacitor 94, the voltage programmed to the gate of transistor to program the "1" state may be less than $0.5 \times V_{EW}$, for example $0.5 \times V_{EW}$-Vth or even less. Such an arrangement may be advantageous since the amplitude of the ENABLE pulse is now only required to be $V_{EW}$ (rather than $V_{EW} + Vth$, as would be typically required to program $V_{EW}$). This is advantageous since it reduces the amplitude of the voltage signals used to drive the ENABLE and DATA lines. Such a reduction may be advantageous for reducing power consumption and also for reducing the physical size of level shifters and buffers integrated into thin film circuitry and used to drive the ENABLE and DATA lines. Reducing the physical size may reduce the overall bezel size of the device as well as improving manufacturing yield.

A potential disadvantage of this embodiment is that the boost effect also occurs, this time deleteriously, in the case where a "0" (e.g. a potential of $-0.5 \times V_{EW}$) is programmed to the gate of transistor 54 in order to non-actuate the element electrode 38. When ACTUATE is taken high, the voltage at the gate of transistor 54 is boosted in the same way as previously described, so as to reach a potential of approximately $-0.5 \times V_{EW} + Vth$. This has the effect of turning on transistor 54 slightly, with the result that the voltage at the element electrode 38 increases slightly. The increase in the potential of the element electrode 38 may only be small and self-limiting, since as the potential of the element electrode 38 rises, the gate to source voltage of transistor 54 correspondingly reduces and this transistor begins to turn off again. The overall effect in this case is that the potential between the element electrode 38 and the reference electrode 28 in the case where the element electrode 38 is non-actuated, instead of being zero volts may be a small DC voltage of order Vth. Since Vth is small relative to the electro-wetting voltage this disadvantage is generally not so important for com-promising the capability of the device to manipulate liquid droplets 4 on the array.

A sixth embodiment of the invention is as the fifth embodiment with an alternative design of array element circuit as shown in FIG. 15. The capacitor 94 is replaced by an active capacitor 110, a device whose capacitance is a function of the voltage between its terminals (that is, the capacitor 110 has a voltage-dependent capacitance). The capacitor 94 may be formed for example with a conductive gate as the positive terminal and using n-type semiconductor material for the negative terminal. The voltage between the positive and negative terminals may be denoted $V_{+-}$. A graph showing the exemplary capacitance versus voltage characteristic of the device is shown in FIG. 16. When $V_{+-}$ is negative, the semiconductor is in depletion and contains few mobile charges. The capacitance of the capacitor is therefore small. When $V_{+-}$ is positive the semiconductor material is in accumulation and contains many mobile charges. The capacitance of the capacitor is therefore large.

The capacitor 94 is connected with the negative terminal connected to the gate of transistor 54 and the positive terminal connected to the signal ACTUATE. The capacitor 94 may be formed for example with a conductive gate as the positive terminal and using n-type semiconductor material for the negative terminal.

The operation of the circuit is as described for the fifth embodiment, but by using an active capacitor 110 as the boost capacitor the circuit is arranged so that the potential at the gate of transistor 54 is boosted when this is desirable and is not boosted when it is not desirable. Consider first the case where the voltage at the gate of transistor 54 is programmed to $\sim +0.5 \times V_{EW}$ (i.e. a "1" is programmed). In this case $V_{+-}$ is approximately $+V_{EW}$ when V1 is low, and as the voltage signal V1 at the input ACTUATE transitions high, voltage V+− remains in excess of Vth for most of the transition. Consequently the capacitance of capacitor 110 is high and the boost effect occurs, boosting the voltage at the gate of transistor 54, as described for the fifth embodiment and as is desirable. Consider next the case where the gate of transistor 54 is programmed to $-V_{EW}$ (a "0" is programmed). In this case $V_{+-}$ is approximately 0 Volts when actuate is low, and goes negative as the voltage signal V1 at ACTUATE transitions high. In this case $V_{+-}$ is a negative voltage and the capacitance of capacitor 110 remains low. This embodiment therefore has the advantages of the fifth embodiment with the additional advantage that the unwanted boost (in the case where a "0" is programmed) does not occur.

A seventh embodiment of the invention is a variant of the fifth embodiment with an alternative design or array element circuit 84 as shown in FIG. 17. In this arrangement capacitor 94 is connected between the gate of transistor 54 and the source of transistor 54. The purpose of capacitor 94 is to provide a boost to the voltage signal programmed onto the gate of transistor 54, in a similar manner to as described for the fifth embodiment.

The operation of the array element circuit 84 is described as follows:

During the programming of data to the array element V1 and V2 must both be taken to low level Data is programmed to the DRAM memory in the array element. The input signal to be programmed is pre-programmed onto line DATA. ENABLE is then taken high and the voltage on DATA is programmed to the gate of transistor 54 and stored on capacitor 56. Transistor 52 is then switched off In the case where a "0" is programmed, transistor 54 is turned off and the element electrode 38 is switched into a high impedance state In the case where a "1" is programmed, transistor 54 is turned on and the input signal V1 driving ACTUATE is connected through to the element electrode 38. At the time when signal V1 goes high, transistor 54 begins to turn on and the potential at the element electrode 38 begins to rise. As a result, the capacitive coupling between the element electrode 38 and the gate of transistor 54 causes the voltage signal at the gate of transistor 54 to be boosted by injection of charge across capacitor 94.

The effect, and also the advantage, of the inclusion of capacitor 94 within the circuit so at to implement a boost operation, is as for the fifth embodiment, that it is no longer necessary to program the voltage at the gate of transistor 54 to be a threshold voltage above the high level voltage signal of V1 for the same reasons as previously described. The other advantages described for the fifth embodiment of reducing the amplitude of driving signals on DATA and ENABLE also apply to this embodiment.

An additional advantage of the seventh embodiment over the fifth embodiment is that it combines the advantages of the fifth embodiment with the advantage of the fourth embodiment, namely that additional capacitance is added at the element electrode 38. This additional capacitance may be beneficial in helping to maintain the DC level of the element electrode 38 potential in the case where a "0" is programmed to the array element and transistor 54 is switched off so that the element electrode 38 is in a high impedance state, as previously described.

A further additional advantage of the seventh embodiment over the fifth embodiment is that by connecting boost capacitor 94 between the element electrode 38 and the gate of transistor 54, the load total capacitance presented at the ACTUATE input terminal is reduced. This reduction in load capacitance is especially appreciable in situations where "0" is programmed to most to the elements in the array, as is frequently typically the case for the device in operation.

This reduction of the ACTUATE input capacitance is advantageous for several reasons; firstly it reduces the power consumption associated with an AC voltage signal being applied to ACTUATE; secondly it increases the maximum frequency at which the signal ACTUATE can be driven, and thus the maximum electro-wetting AC frequency associated with the operation of the device and thirdly, in the case where the voltage signal V1 applied to ACTUATE signal is arranged to be driven separately for each line of the array (as described in the second embodiment of the invention), the physical size and power consumption of the thin film electronics circuitry required to buffer the ACTUATE signal is also reduced.

A potential disadvantage of the seventh embodiment is that the boost effect also occurs, this time deleteriously, in the case where a "0" (e.g. a potential of $-0.5 \times V_{EW}$) is programmed to the gate of transistor 54 in order to set the element electrode 38 into a non-actuated state. In this case the unwanted AC coupling is associated with the rising edge of the signal V2 applied to the reference electrode 28 being coupled across the liquid droplet 4 (where present) to the element electrode 38. This in turn results in a further coupling of the perturbed across the capacitor 94 to the gate of transistor 54 where it causes the unwanted boost signal. However this disadvantage may only be significant in the situation where a liquid droplet 4 is present at the element electrode 38. This is because without a liquid droplet 4 being present, there may not be a substantial capacitance associated with the load circuit 40. The coupling of V2 to the element electrode 38 may therefore not be very significant.

An eighth embodiment of the invention is as the seventh embodiment with an alternative design of array element circuit 84 as shown in FIG. 18. The capacitor 94 is replaced by an active capacitor 110, the active capacitor having a construction as previously described. The operation of the eighth embodiment is as the seventh embodiment, with the exception that the active capacitor 110 now only boosts the voltage at the gate of transistor 54 selectively and in accordance with the sign of the voltage across it. The active capacitor is so arranged such that when a "1" is programmed to the array element circuit 84, the sign and amplitude of the voltage across the active capacitor 110 results in it maintaining a significant capacitance so that the voltage at the gate of transistor 54 is boosted. This has the same effect, and realizes the same advantages as were previously described for the seventh embodiment. By contrast, when a "0" is programmed to the array element, the sign and magnitude of the voltage across the active capacitor 110 are such that its capacitance is only very small. In this case any boost applied to the voltage at the gate of transistor 54 (as caused by any change in the potential of the element electrode 38) is minimized. The eighth embodiment is thus advantageous over the seventh embodiment in avoiding the specified disadvantage of the seventh embodiment, specifically that the unwanted boost to the potential at the gate of transistor 54 no longer occurs (or is very small) when a "0" is programmed and transistor 54 is in a high impedance state.

A ninth embodiment of the invention is as the first embodiment except with an alternative array element circuit 84 as shown in FIG. 19. In this embodiment the DRAM memory element comprising transistor 52 and capacitor 56 has been replaced by an SRAM memory element, which may be of standard construction, for example as described in U.S. Pat. No. 8,173,000.

The operation of the ninth embodiment is similar to as previously described, the gate of transistor 54 may be programmed to $+0.5 \times V_{EW}$ to set the array element in actuated state or to $-0.5 \times V_{EW}$ to set the array element into a non-actuated state. Data is programmed and stored in the SRAM memory element in an analogous way to as previously described for the previous embodiments having a DRAM memory element. An advantage of the ninth embodiment is that by using an SRAM memory element 96, there is no requirement to periodically refresh the data programmed to the SRAM element. This may reduce the overall power consumption of the device.

A tenth embodiment of the invention is as the first embodiment except with an alternative array element circuit 84 as shown in FIG. 20. The array element circuit 84 is as the first embodiment except that capacitor 56 has been removed. The array element circuit 84 of the tenth embodiment is simplified as it does not contain a memory element or have any memory capability. Operationally, transistor 52 acts as an addressing device, such that when the ENABLE signal is taken high such that transistor 52 is switched on, the voltage at input line DATA is connected through to the gate of transistor 54. Accordingly, in this embodiment, unique driving signals can only be applied to elements in the array on a per column basis, i.e. all the rows in the array must be driven in the same way at any one time. The rest of the array element circuit 84 then functions as previously described. An advantage of the eleventh embodiment is that by removing both capacitor 56 and addressing line VDD from the circuit, the physical layout of the array element circuit 84 becomes much smaller, having just two transistors and three addressing lines. This in turn may facilitate devices with smaller array elements to be realized with all the advantages this brings as has previously been described.

According to an eleventh embodiment of the invention, the device may also contain a sensor function integrated into each array element. The overall arrangement of the array element circuit 84 is shown in FIG. 21. The actuation circuit 46 connects to the element electrode 38 and may be of a design as described for any of the previous embodiments, for example having inputs DATA, ENABLE and ACTUATE. The array element circuit 84 also contains a sensor circuit 48, for sensing a property of the element electrode 38, typically the electrical impedance presented at the element electrode 38. The sensor circuit 48 may contain one or more inputs, for example RW and have one or more outputs, for example OUT as shown in FIG. 21. FIG. 22 shows an example arrangement of thin film electronics 74 according to this embodiment. Compared to the first embodiment, the thin film electronics may also contain additionally sensor row addressing circuitry 88 for supplying control signals to the sensor circuit inputs (e.g. RW) of the array element circuit 84 and column detection circuits 86 for processing and reading out the output signals from the sensor circuit part of the array element circuit 84. A detailed description of example constructions of the sensor circuit 48 and appropriate readout circuitry are contained in US application 2012/0007608 which may be considered as being incorporated by reference into the present invention.

The sensor may, for example, be configured to sense capacitance (impedance) and thus perform the operations of detecting the presence and size of liquid droplets 4 at each array element location in the electrode array 42.

An example array element circuit 84 according to the eleventh embodiment of the invention is shown in detail FIG. 23. The array element circuit 84 combines the arrangement of the first embodiment with sensor circuits described in U.S. Pat. No. 8,653,832.

The array element circuit according to this embodiment is connected as follows. The drain of transistor 52 is connected to the input DATA which may be common to all elements in the same column of the array. The gate of transistor 52 is connected to the input ENABLE which may be common to all elements in the same row of the array. The source of transistor 52 is connected to the gate of transistor 54. Capacitor 56 is connected between the gate of transistor 54 and a DC voltage source VDD. The drain of transistor 54 is connected to input signal ACTUATE which may be common to all elements in the array. Transistor 98 is connected between the source of transistor 54 and the element electrode 38. The gate of transistor 98 is connected to an input SEN which may be common to all elements in the same row of the array. Capacitor 106 is connected between the element electrode 38 and input signal RWS which may be common to all elements in the same row of the array. Capacitor 104 is connected between the element electrode 38 and the gate of transistor 102. The drain of transistor 102 is connected to a DC voltage source VDD. The source of transistor 102 is connected to output OUT which may be common to all elements in the same column of the array. Transistor 100 is connected between the gate of transistor 102 and a voltage supply VRST which may be common to all elements in the array. The gate of transistor 100 is connected to an input signal RST which may be common to all elements in the same row of the array. The actuator circuit comprises transistor 52, transistor 54 and capacitor 56 and the inputs DATA, ENABLE and ACTUATE. The sensor circuit comprises capacitor 106, capacitor 104, transistor 100, transistor 102 and terminal connections RWS, RST, VRST and COL. Transistor 98, the element electrode 38, the electrode load 40 and the reference electrode 28 form a part of both the actuator circuit and sensor circuit.

The operation of the array element circuit according to this embodiment combines the descriptions of operation of the first embodiment of this invention and the description of the sensor circuit from U.S. Pat. No. 8,653,832.

The operation of the actuator circuit is described as follows. During operation of the actuator circuit, input SEN is taken to a voltage high level so transistor 98 is turned on. The element electrode 38 is therefore connected to the source of transistor 54. The actuator circuit then functions as previously described with AC voltage signal applied to ACTUATE and V2 and transistor 54 programmed to actuate the element electrode 38, or else transistor 54 is programmed to a high impedance state to de-actuate the element electrode 38.

The operation of the sensor circuit is described as follows. Input SEN is taken to a voltage low level, and the actuate circuit (transistors 52 and 54, capacitor 56 and input signals DATA, ENABLE and ACTUATE) is in effect disconnected from the rest of the circuit. The impedance is sensed as follows:

V2 is held in a static state for the period of the sense operation

Input signal RST is briefly taken high. As a result transistor 100 is turned on and the potential at the gate of transistor 102 is charged/discharged to the potential of the input supply VRST Input signal RWS is taken high. As a result the potential at the element electrode 38 is perturbed. The capacitor 106 forms a part of a potential divider. The extent to which the potential at the element electrode 38 is perturbed is determined primarily by the ratio of the capacitance of capacitor 106 and the effective capacitance of the load circuit 40, as is fully described in U.S. Pat. No. 8,653,832

The perturbation of the potential at the element electrode 38 also results in a perturbation of the potential at the gate of transistor 102, due to capacitive coupling through capacitor 104. The potential at the gate of transistor 102 is thus perturbed by an amount dependent on the electrical load circuit 40 presented at the element electrode 38

The perturbation at the gate of transistor 102 results in transistor 102 being turned on to some extent. Transistor 102 may be biased so as to function as the input device of a source follower, with the load device, for example being formed as part of the column detection circuit 86. Therefore a current is arranged to flow through transistor 102 and this current may be measured by the column detection circuit 86.

An advantage of the eleventh embodiment is that an additional sensor function is incorporated into the AM-EWOD device. The sensor may perform various functions, for example measuring the position, size and properties of liquid droplets on the array as is fully described in U.S. Pat. No. 8,653,832.

Whilst in the preceding embodiments, the invention has been described in terms of an AM-EWOD device utilizing thin film electronics 74 to implement array element circuits and driver systems in thin film transistor (TFT) technology, the invention could equally be realized using other standard electronic manufacturing processes, e.g. Complementary Metal Oxide Semiconductor (CMOS), bipolar junction transistors (BJTs), etc.

Although the invention has been shown and described with respect to a certain embodiment or embodiments, equivalent alterations and modifications may occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein exemplary embodiment or embodiments of the invention. In addition, while a particular feature of the invention may have been described above with respect to only one or more of several embodiments, such feature may be combined with one or more other features of the other embodiments, as may be desired and advantageous for any given or particular application.

Optionally the device may also be arranged such that embodiments of the invention may be utilized in just a part or sub-array of the entire device. Optionally some or all of the multiple different embodiments may be utilized in different rows columns or regions of the device.

In a method of the first aspect, the first alternating voltage and the second alternating voltage may have the same shape of waveform as one another. For example, the first alternating voltage and the second alternating voltage may each have a sinusoidal waveform, a triangular waveform, or a square waveform.

The method may comprise applying the first alternating voltage and a second alternating voltage to be substantially in anti-phase with one another.

The first alternating voltage and the second alternating voltage may have the same peak amplitude as one another.

At least one of the first alternating voltage and the second alternating voltage may comprise a DC offset component.

Applying the second alternating voltage to the element electrode may comprise connecting the element electrode to a source of the second alternating voltage and wherein holding the element electrode in the high impedance state comprises isolating the element electrode from the source of the second alternating voltage.

The method may comprise arranging for an instantaneous value of the second alternating voltage to be equal to an instantaneous value of the first alternating voltage at a time of putting the element electrode into the high impedance state.

The AM-EWOD device may comprise a plurality of AM-EWOD elements arranged in a matrix of rows and columns, and wherein the method may comprise arranging for an instantaneous value of the second alternating voltage applied to a row of AM-EWOD elements to be equal to an instantaneous value of the first alternating voltage at a time of putting the element electrodes of AM-EWOD elements of the row into the high impedance state.

In a circuit of the second aspect, the first switch may be connected between the input node and the output node, a control terminal of the first switch being connected to an output of the memory element.

The first switch may be a first transistor. The first transistor may be of a low leakage design, for example a Lightly Doped Drain (LDD) transistor.

The memory element may comprise:
a second switch connected between a data input and the control terminal of the first switch, a control terminal of the second switch being connected to a first control input; and
a first capacitor connected between the control terminal of the first switch and a bias voltage.

The second switch may be a second transistor.

The first transistor and the second transistor may be transistors of the same channel type as one another.

The circuit may comprise a third switch connected between a source of the second alternating voltage and the output node, and a control terminal of the third switch may be connected to a second control input.

The circuit may comprise a second capacitor connected between the output node and a source of a bias voltage.

The circuit may comprise a third capacitor connected between the control terminal of the first switch and the input node.

The third capacitor may have a voltage-dependent capacitance.

Alternatively the memory element may comprise a static read-only memory (SRAM).

The circuit may further comprise a sensor circuit connected between the output node and a sensing output node.

In a device of the third aspect, at least one of the array element circuits may be an array element circuit of the second aspect.

For a fuller understanding of the nature and advantages of the invention, reference should be made to the ensuing detailed description taken in conjunction with the accompanying drawings.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

The described embodiments could be used to provide an enhance AM-EWOD device. The AM-EWOD device could form a part of a lab-on-a-chip system. Such devices could be used in manipulating, reacting and sensing chemical, biochemical or physiological materials. Applications include healthcare diagnostic testing, material testing, chemical or biochemical material synthesis, proteomics, tools for research in life sciences and forensic science.

REFERENCE SIGNS LIST

4 liquid droplet
6 contact angle θ
16 First hydrophobic coating

20 Insulator layer
26 Second hydrophobic coating
28 Reference electrode
32 Spacer
34 Non-polar fluid
36 Top substrate
38/38A and 38B Array Element Electrodes
40 Electrical load
42 Electrode array
46 Actuation circuit
48 Sensor circuit
52 Transistor
54 Transistor
56 Capacitor
72 Lower Substrate
74 Thin film electronics
76 Row driver circuit
78 Column driver circuit
80 Serial interface
82 Connecting wires
83 Voltage supply interface
84 Array element circuit
85 Reference electrode drive circuit
86 Column detection circuit
88 Sensor row addressing
90 Transistor
94 Capacitor
96 SRAM
98 Transistor
100 Transistor
102 Transistor
104 Capacitor
106 Capacitor
108 Capacitor
110 Active capacitor

The invention claimed is:

1. A circuit for selectively providing an alternating voltage to an AM-EWOD element electrode, the circuit having a memory element, an input node for connection to a source of an alternating voltage, an output node for connection to the AM-EWOD element electrode, and a first switch for addressing the output node by, in dependence on a data value stored in the memory element, any one of electrically connecting the input node to the output node and electrically isolating the input node from the output node;
wherein the circuit is configured such that when the output node is electrically isolated from the input node, the output node is at a floating potential with the element electrode placed in a high impedance state.

2. A circuit as claimed in claim 1, wherein the first switch is connected between the input node and the output node, a control terminal of the first switch being connected to an output of the memory element, wherein the first switch is a first transistor, and wherein the first transistor is of a low leakage design comprising a Lightly Doped Drain (LDD) transistor.

3. A circuit as claimed in claim 1 wherein the memory element comprises:
a second switch connected between a data input and the control terminal of the first switch, a control terminal of the second switch being connected to a first control input; and
a first capacitor connected between the control terminal of the first switch and a bias voltage.

4. A circuit as claimed in claim 3 wherein the second switch is a second transistor.

5. A circuit as claimed in claim 1
wherein the memory element comprises:
a second switch connected between a data input and the control terminal of the first switch, a control terminal of the second switch being connected to a first control input; and
a first capacitor connected between the control terminal of the first switch and a bias voltage;
wherein the second switch is a second transistor; and
wherein the first transistor and the second transistor are transistors of the same channel type as one another.

6. A circuit as claimed in claim 1 and comprising a third switch connected between a source of the second alternating voltage and the output node, a control terminal of the third switch being connected to a second control input.

7. A circuit as claimed in claim 1 and comprising a second capacitor connected between the output node and a source of a bias voltage.

8. A circuit as claimed in claim 1 and comprising a third capacitor connected between the control terminal of the first switch and the input node, wherein the third capacitor has a voltage-dependent capacitance.

9. A circuit as claimed in claim 1 wherein the memory element comprises a static read-only memory (SRAM).

10. A circuit as claimed in claim 1 and further comprising a sensor circuit connected between the output node and a sensing output node.

11. An active matrix EWOD device having a plurality of AM-EWOD elements, each element having an element electrode and a reference electrode, the device comprising a reference electrode drive circuit for applying a first alternating voltage to the reference electrode and array element circuits for addressing the element electrode of a respective AM-EWOD element by any one of (i) applying a second alternating voltage to the element electrode and (ii) putting the element electrode of the respective AM-EWOD element in a high impedance state, wherein the second alternating voltage has the same frequency as the first alternating voltage and the second alternating voltage is out of phase with the first alternating voltage,
wherein at least one of the array element circuits is an array element circuit as defined in claim 1.

12. A circuit as claimed in claim 1, further comprising a reference electrode spaced oppositely from the element electrode, wherein when the output node is electrically isolated from the input node, a voltage applied to the reference electrode is capacitively coupled to the element electrode when a droplet is present at the element electrode.

13. A circuit as claimed in claim 1, wherein the input node further is connectable to a source of a second alternating voltage, and prior to the first switch switching from electrically connecting the input node to the output node to electrically isolating the input node from the output node, the second alternating voltage is applied to the output node to pre-charge the element electrode to the second alternating voltage.

* * * * *